(12) United States Patent
Zhou et al.

(10) Patent No.: US 12,197,727 B2
(45) Date of Patent: Jan. 14, 2025

(54) DYNAMIC STORAGE FOR ADAPTIVE MAPPING FOR DATA COMPRESSION ON A STORAGE DEVICE

(71) Applicant: Lemon Inc., Grand Cayman (KY)

(72) Inventors: Ping Zhou, Los Angeles, CA (US); Kan Frankie Fan, Los Angeles, CA (US)

(73) Assignee: Lemon Inc., Grand Cayman (KY)

( * ) Notice: Subject to any disclaimer, the term of this patent is extended or adjusted under 35 U.S.C. 154(b) by 0 days.

(21) Appl. No.: 18/312,170

(22) Filed: May 4, 2023

(65) Prior Publication Data
US 2023/0273727 A1     Aug. 31, 2023

(51) Int. Cl.
*G06F 3/06*     (2006.01)

(52) U.S. Cl.
CPC .......... *G06F 3/0608* (2013.01); *G06F 3/0631* (2013.01); *G06F 3/0659* (2013.01); *G06F 3/067* (2013.01)

(58) Field of Classification Search
CPC .... G06F 3/0608; G06F 3/0631; G06F 3/0659; G06F 3/067; G06F 3/061; G06F 3/064; G06F 2206/1004
See application file for complete search history.

(56) References Cited

U.S. PATENT DOCUMENTS

| | | |
|---|---|---|
| 10,664,165 B1 | 5/2020 | Faibish et al. |
| 2014/0006354 A1* | 1/2014 | Parkison ............... G06F 3/0635 707/661 |
| 2019/0065392 A1* | 2/2019 | Erez ..................... G06F 12/0246 |
| 2020/0142820 A1 | 5/2020 | Schneider et al. |
| 2020/0310964 A1* | 10/2020 | Lu ......................... G06F 3/0608 |

FOREIGN PATENT DOCUMENTS

CN     110908608 A     3/2020

OTHER PUBLICATIONS

Extended European Search Report in European Appln No. 24173204.9, dated Oct. 1, 2024, 12 pages.
Communication pursuant to Rules 70(2) and 70a(2) EPC and reference to Rule 39(1) EPC for European Application No. 24173204.9, mailed Nov. 11, 2024, 2 pages.

* cited by examiner

*Primary Examiner* — Francisco A Grullon
(74) *Attorney, Agent, or Firm* — Fish & Richardson P.C.

(57) ABSTRACT

Methods and systems for adaptive mapping for data compression on a storage device is provided. The method includes determining a data request pattern of a workload, determining whether to use at least one of a segment mapping mode or a hash mapping mode for mapping the workload, dividing a space on the storage device into a plurality of defrag units for storing data, and assigning the plurality of defrag units as being at least one of a segment defrag unit or a hash defrag unit. The method also includes when the data request pattern is for the segment mapping mode, storing the data on at least one of the plurality of defrag units assigned as the segment defrag unit, and when the data request pattern is for the hash mapping mode, storing the data on at least one of the plurality of defrag units assigned as the hash defrag unit.

18 Claims, 12 Drawing Sheets

DYNAMIC STORAGE FOR ADAPTIVE MAPPING FOR DATA COMPRESSION ON A STORAGE DEVICE

FIELD

The embodiments described herein pertain generally to device level compression mapping and storage. More specifically, the embodiments described herein pertain to dynamic storage for adaptive mapping for device level compression on a storage device.

BACKGROUND

Block storage, or referred to as block-level storage, is a common form of storage that is used to store data in blocks e.g., on storage area networks, in cloud-based storage environments, etc. Each block may be stored as a separate piece with a unique identifier. Cloud-based block storage or storage device is a common product offered by cloud service providers (CSPs). In block storage or storage devices, transparent compression, e.g., agnostic or having no visible effects by the host or user on how the workload or data is compressed, may be a desirable feature for block storage. Transparent compression may be done at the block device level and the compression may be transparent to the host (e.g., a server running the user's applications without seeing how the file is compressed at the block device level), and no additional software change may be needed on the host. The mapping between the uncompressed block addresses and compressed block addresses needs to be maintained and tracked carefully due to e.g., the non-linear mapping between the compressed address (i.e., the address for the block storage device) and the uncompressed address (i.e., the address presented to the host). Depending on e.g., the workload, the amount of data (and mapping thereto) may be significantly different, e.g., reduced when the workload is compressible, which can reduce the cost for storage.

SUMMARY

Features in the embodiments disclosed herein may help optimize data storage management performance by leveraging an adaptive mapping scheme that dynamically switches between at least two mapping modes, such as, segment mapping and hash mapping, for mapping and/or storing a workload, e.g., including a logical block address (LBA), during data storage and/or compression on the storage device. In an embodiment, a data request pattern, for example, an input/output (I/O) request pattern from the workload, may be determined and the mapping scheme may be dynamically switched between at least two mapping modes, e.g., the segment mapping and hash mapping, to accommodate different read/write patterns at runtime and achieve higher performance, rendering a higher throughput or bandwidth and/or a lower overhead on the block device.

While such adaptive mapping schemes may have many benefits and improvements over prior mapping schemes, the adaptive mapping scheme may be improved by addressing the following:

Since the compressibility of data varies across the disk, the physical capacity needed for compressed data is constantly changing at runtime, so that the efficient use of the adaptive mapping scheme may not be fully utilized. For example, some blocks (of data) may contain data with higher compression rates, while some other blocks may have lower compression rates, and the compression rates of each data block might change over time (e.g. when a block is overwritten with new data). As such an efficient capacity management scheme may need to be used to address the variation of compressibility of the data.

Since the at least two mapping modes, e.g., segment mapping and hash mapping, have different characteristics, e.g., mapping characteristics, when both modes are applied to the same uncompressed address space, the mapping modes may interfere with each other. For example, since segment mapping may allocate space continuously in larger, e.g., 32 KB segment, units, while hash mapping may allocate randomly in smaller units, e.g., 4 KB blocks, when both modes are applied at runtime, hash mapping may result in increased fragmentation, which may impact the allocation during the segment mapping mode.

In some embodiments, since the at least two mapping modes have different characteristics, the at least two mapping modes, e.g., segment mapping and hash mapping, may require different data reallocation or garbage collection (GC) mechanisms. For example, garbage collection for segment mapping may be relatively easier because a segment may be remapped as needed, e.g., removing and/or combining holes or spaces on the block, while garbage collection for hash mapping may be more complicated due to the fixed nature of hash mapping, e.g., since hash mapping uses hash functions for fixed mapping, i.e., an uncompressed LBA may not be remapped to an arbitrary address.

As such, features in the embodiments disclosed herein are directed to optimizing data storage management, e.g., efficient data capacity management, on a storage device by leveraging the data request pattern of the work load to efficiently manage capacity of the uncompressed space and/or of the compressed space of the storage device. Some example embodiments may include the dynamic storage of data on units or segments in the compressed space based on the mapping mode and/or by automatically adapting the compressed space to optimize and/or maximize the compressed space for dynamically changing workload patterns. That is, instead of mixing the mapping methods to the same segment or unit, e.g., defrag unit, each segment or unit is assigned for one mapping mode. Moreover, the segment or unit may be dynamically released and reassigned/reallocated as necessary, e.g., the segment or unit may be adapted to the user's usage at runtime, for example, based on the workload's data request pattern. Thus, features in the embodiments disclosed herein that include dynamically switching between at least two mapping modes may be able to accommodate the read/write pattern at runtime and achieve higher performance, while also being able to manage changing, e.g., unpredictable and/or dynamic, compression rates of each data block, avoid interference between the different mapping modes, and/or reallocate portions of the data space, e.g., unused or non-used data space, to maximize or optimize the storage of data on the data space, for example, using a garbage collection mechanism.

In some embodiments, the adaptive mapping scheme may leverage a data request pattern, which may be an Input/Output (I/O) request pattern, from the workloads, rendering a higher throughput or bandwidth and/or a lower overhead on the data storage device when handling sequential data request patterns. In some example embodiments, a segment based mapping may be used for sequential I/O for better throughput which may use segment defrag units or segments for the mapping of the data. A hash mapping, for example, a flat hash table based mapping, may be used for random I/O for low latency which may use hash defrag units or segments for the mapping of the data. The mapping scheme disclosed herein may adapt to the sequential I/O and/or the random I/O dynamically, and may enjoy the advantages of both the segment based mapping and the hash mapping schemes.

In one example embodiment, a method for adaptive mapping for data compression on a storage device is provided. The method includes determining a data request pattern of a workload for storing on the storage device, determining whether to use at least one of a segment mapping mode or a hash mapping mode for mapping the workload based on the data request pattern, dividing a space on the storage device into a plurality of defrag units for storing data, and assigning the plurality of defrag units as being at least one of a segment defrag unit for a segment zone for serving the segment mapping mode or a hash defrag unit for a hash zone for serving the hash mapping mode. When the data request pattern is for the segment mapping mode, the method further includes storing the data on at least one of the plurality of defrag units assigned as the segment defrag unit. When the data request pattern is for the hash mapping mode, the method further includes storing the data on at least one of the plurality of defrag units assigned as the hash defrag unit.

In another example embodiment, a method for adaptive managing for data on a storage device is provided. The method includes dividing uncompressed data space into a plurality of partitions; dividing a compressed data space on the storage device into a plurality of storage segments; assigning segments of the plurality of storage segments to each of the plurality of partitions; and dynamically managing storage of the data for the storage device by dynamically storing the data between storing the data on the segments of the plurality of storage segments assigned to the plurality of partitions.

In yet another embodiment, a storage device control system is provided. The system includes a memory region tracking a shared mapping table and a processor. The processor is configured to determine a data request pattern of a workload for storing on the storage device, determine whether to use at least one of a segment mapping mode or a hash mapping mode for mapping the workload based on the data request pattern, divide a space on the storage device into a plurality of defrag units for storing data, assign the plurality of defrag units as being at least one of a segment defrag unit for a segment zone for serving the segment mapping mode or a hash defrag unit for a hash zone for serving the hash mapping mode. When the data request pattern is for the segment mapping mode, the data is stored on at least one of the plurality of defrag units assigned as the segment defrag unit. When the data request pattern is for the hash mapping mode, the data is stored on at least one of the plurality of defrag units assigned as the hash defrag unit.

In yet another example embodiment, a non-transitory computer-readable medium having computer-executable instructions stored thereon is provided. The non-transitory computer-readable medium having computer-executable instructions stored thereon, upon execution, cause one or more processors to perform operations including: determining an input/output (I/O) request pattern of a workload for storing on a storage device, determining whether to use at least one of a segment mapping mode or a hash mapping mode for mapping the workload based on the I/O request pattern, dividing space on storage device into a plurality of defrag units for storing data, and assigning the plurality of defrag units as being at least one of a segment defrag unit for a segment zone for serving the segment mapping mode or a hash defrag unit for a hash zone for serving the hash mapping mode. When the I/O request pattern is for the segment mapping mode, the data is stored on at least one of the plurality of defrag units assigned as the segment defrag unit. When the I/O request pattern is for the hash mapping mode, the data is stored on at least one of the plurality of defrag units assigned as the hash defrag unit.

As such, the systems and methods, as discussed herein, may be configured and provided to adapt to workload patterns automatically and/or adjust the data space dynamically for efficient data capacity management. In some embodiments, by dividing the uncompressed data space and/or the compressed data space on a storage device into discrete portions and assigning portions of the compressed data space to the uncompressed data space based on the workload patterns dynamically, the number of portions in the compressed data space may be optimized for the data to be stored on the storage device e.g., data storage based on the workload and/or LBA address. Moreover, the allocation of the different portions of the compressed data space may be adjusted automatically to be adapted or adjusted based on the workload pattern, which may occur at runtime and/or reallocated based on the usage of the particular portion, e.g., via a garbage collection mechanism. Still further, the non-used portions of the compressed data space may be reallocated, e.g., defragmentation of non-used data space, dynamically, e.g., when certain predetermined thresholds are reached.

BRIEF DESCRIPTION OF THE DRAWINGS

The accompanying drawings illustrate various embodiments of systems, methods, and embodiments of various other aspects of the disclosure. Any person with ordinary skills in the art will appreciate that the illustrated element boundaries (e.g. boxes, groups of boxes, or other shapes) in the figures represent one example of the boundaries. It may be that in some examples one element may be designed as multiple elements or that multiple elements may be designed as one element. In some examples, an element shown as an internal component of one element may be implemented as an external component in another, and vice versa. Non-limiting and non-exhaustive descriptions are described with reference to the following drawings. The components in the figures are not necessarily to scale, emphasis instead being placed upon illustrating principles. In the detailed description that follows, embodiments are described as illustrations only since various changes and modifications may become apparent to those skilled in the art from the following detailed description.

DETAILED DESCRIPTION

Figure 1:
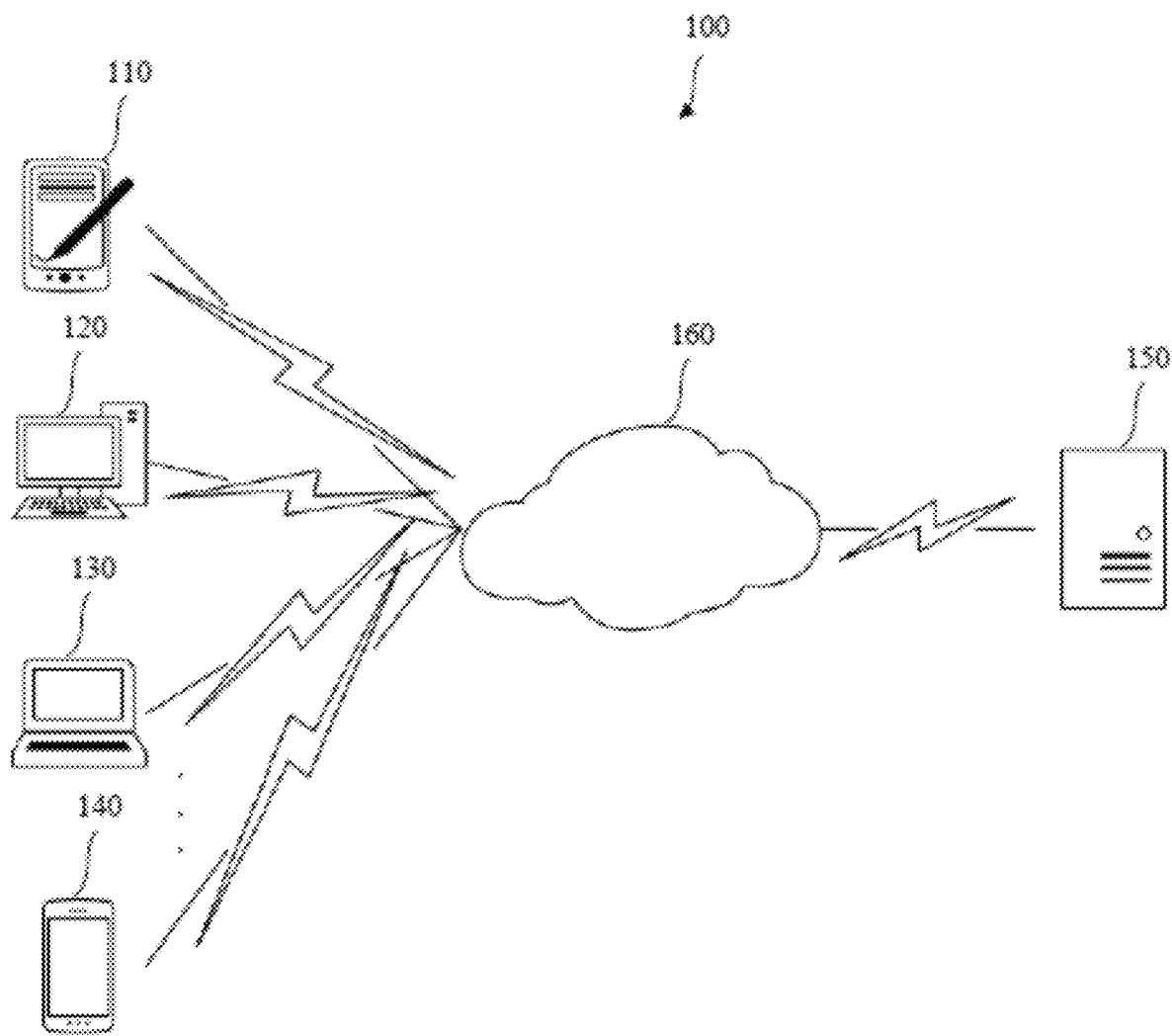
FIG. 1 is a schematic view of an example cloud-based block storage system, arranged in accordance with at least some embodiments described herein.

In the following detailed description, particular embodiments of the present disclosure are described herein with reference to the accompanying drawings, which form a part of the description. In this description, as well as in the drawings, like-referenced numbers represent elements that may perform the same, similar, or equivalent functions, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not intended to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

It is to be understood that the disclosed embodiments are merely examples of the disclosure, which may be embodied in various forms. Well-known functions or constructions are not described in detail to avoid obscuring the present disclosure in unnecessary detail. Therefore, specific structural and functional details disclosed herein are not to be interpreted as limiting, but merely as a basis for the claims and as a representative basis for teaching one skilled in the art to variously employ the present disclosure in virtually any appropriately detailed structure.

Additionally, the present disclosure may be described herein in terms of functional block components and various processing steps. It should be appreciated that such functional blocks may be realized by any number of hardware and/or software components configured to perform the specified functions, for example, upon execution by a processor.

The scope of the disclosure should be determined by the appended claims and their legal equivalents, rather than by the examples given herein. For example, the steps recited in any method claims may be executed in any order and are not limited to the order presented in the claims. Moreover, no element is essential to the practice of the disclosure unless specifically described herein as "critical" or "essential".

As referenced herein, "block" in data storage may refer to a fixed-size amount of storage within a storage medium that is capable of storing a piece of data. It is to be understood that data may be stored in blocks, and each block may be assigned a unique address or identifier. In an example embodiment, the size of each block may be 4 KB. For example, in the embodiments described herein, the uncompressed block address (presented to and used by the host or application(s) running on the host) and/or the compressed block address (for a block storage device) may correspond to a space in a unit of a 4 KB block.

As referenced herein, "hash function" may refer to a function that converts an input (e.g., a numerical value) into an output (e.g., another numerical value). It is to be understood that a hash function is a term of art and may be used in data storage and/or retrieval application(s) to access data in a small and nearly constant time per retrieval.

As referenced herein, "metadata" may refer to data that provides information about other data, but not the content of the data. It is to be understood that metadata may be referred to as "data about data", i.e., data providing information about one or more aspects of other data. In some example embodiments, metadata may include time and date of creation, size of the data, source of the data, usage of data, linkage between two pieces of data, etc.

As referenced herein, "block address", "logical block address" or "LBA" may refer to an address or location of blocks of data stored on computer storage device(s) such as a block device (e.g., a disk, or the like). It is to be understood that a block device may be addressed by a host using logical block addressing mechanism, which assigns each block (e.g., having a size of 4 KB or the like) on the block device a storage number/address (a logical block address) starting at zero. The controller or processor (e.g., in 220 of FIG. 2) of the block device is then responsible for mapping the logical block addresses to physical locations on the block device.

As referenced herein, "segment" may refer to a memory page (or a portion of a memory page or group of portions of a memory page) that includes the data of some adjacent disk sectors. It is to be understood that a segment has a boundary (e.g., in the logical block addressing, etc.). In an example embodiment, a segment may have a size of 32 KB. It is also to be understood that a segment may have any suitable size. It is also to be understood that the entire logical block address space may be represented by segment numbers starting at zero.

As referenced herein, a "sequential" read or write (or a "sequential" input or output or a "sequential" I/O) of the host may refer to a host read or write (or I/O) of data having a size of a segment or more. A "random" read or write (or a "random" input or output or a "random" I/O) of the host may refer to a host read or write (or I/O) of data having a size less than a size of a segment.

As referenced herein, "garbage collection" may refer to memory (or data) space management, e.g., non-RAM or ROM, including but not limited to, assignment/reassignment of defrag units based on needs of the system and/or partition, reduction/reallocation of non-used data space (fragmentation) of the defrag unit, e.g., defragmentation, freeing any non-referenced and/or non-used data space, e.g., previous written data and need to be overwritten, or the like.

FIG. 1 is a schematic view of a storage system 100, for example, a cloud-based block storage system, arranged in accordance with at least some embodiments described herein.

The system 100 may include terminal devices 110, 120, 130, and 140, a network 160, and a server (i.e., a host) 150. It is to be understood that FIG. 1 only shows illustrative numbers of the terminal devices, the network, and the server. The embodiments described herein are not limited to the number of the terminal devices, the network, and/or the server described. That is, the number of terminal devices, networks, and/or servers described herein are provided for descriptive purposes only and are not intended to be limiting.

In accordance with at least some example embodiments, the terminal devices 110, 120, 130, and 140 may be various electronic devices. The various electronic devices may include but not limited to a mobile device such as a smartphone, a tablet computer, an e-book reader, a laptop computer, a desktop computer, and/or any other suitable processor enabled electronic devices.

In accordance with at least some example embodiments, the network 160 may be a medium used to provide a communications link between the terminal devices 110, 120, 130, 140 and the server 150. The network 160 may be the Internet, a local area network (LAN), a wide area network (WAN), a local interconnect network (LIN), a cloud, etc. The network 160 may be implemented by various types of connections, such as a wired communications link, a wireless communications link, an optical fiber cable, etc.

In accordance with at least some example embodiments, the server 150 may be a server for providing various services, such as a server for providing cloud services (including e.g., cloud storage and/or retrieval service, etc.) to the users using one or more of the terminal devices 110, 120, 130, and 140. The server 150 may be implemented by a distributed server cluster including multiple servers or may be implemented by a single server.

A user may use one or more of the terminal devices 110, 120, 130, and 140 to interact with the server 150 via the network 160. Various applications, such as social media applications or the like, may be installed on the terminal devices 110, 120, 130, and 140.

It is to be understood that software applications or services according to the embodiments described herein and/or according to the services provided by the cloud service providers may be performed by the server 150 and/or the terminal devices 110, 120, 130, and 140 (which may be referred to herein as user devices). Accordingly, the apparatus for the software applications and/or services may be arranged in the server 150 and/or in the terminal devices 110, 120, 130, and 140.

It is also to be understood that in a case that a service is not performed remotely, the system 100 may not include the network 160, but include only the terminal device 110, 120, 130, and 140 and/or the server 150.

It is further to be understood that the terminal device 110, 120, 130, and 140 and/or the server 150 may each include one or more processors, a memory, and a storage device storing one or more programs. The terminal device 110, 120, 130, and 140 and/or the server 150 may also each include an Ethernet connector, a wireless fidelity receptor, etc. The one or more programs, when being executed by the one or more processors, may cause the one or more processors to perform the method(s) described in any embodiments described herein. Also, it is to be understood that a computer readable non-volatile medium may be provided according to the embodiments described herein. The computer readable medium stores computer programs. The computer programs are used to, when being executed by a processor, perform the method(s) described in any embodiments described herein.

Figure 2:
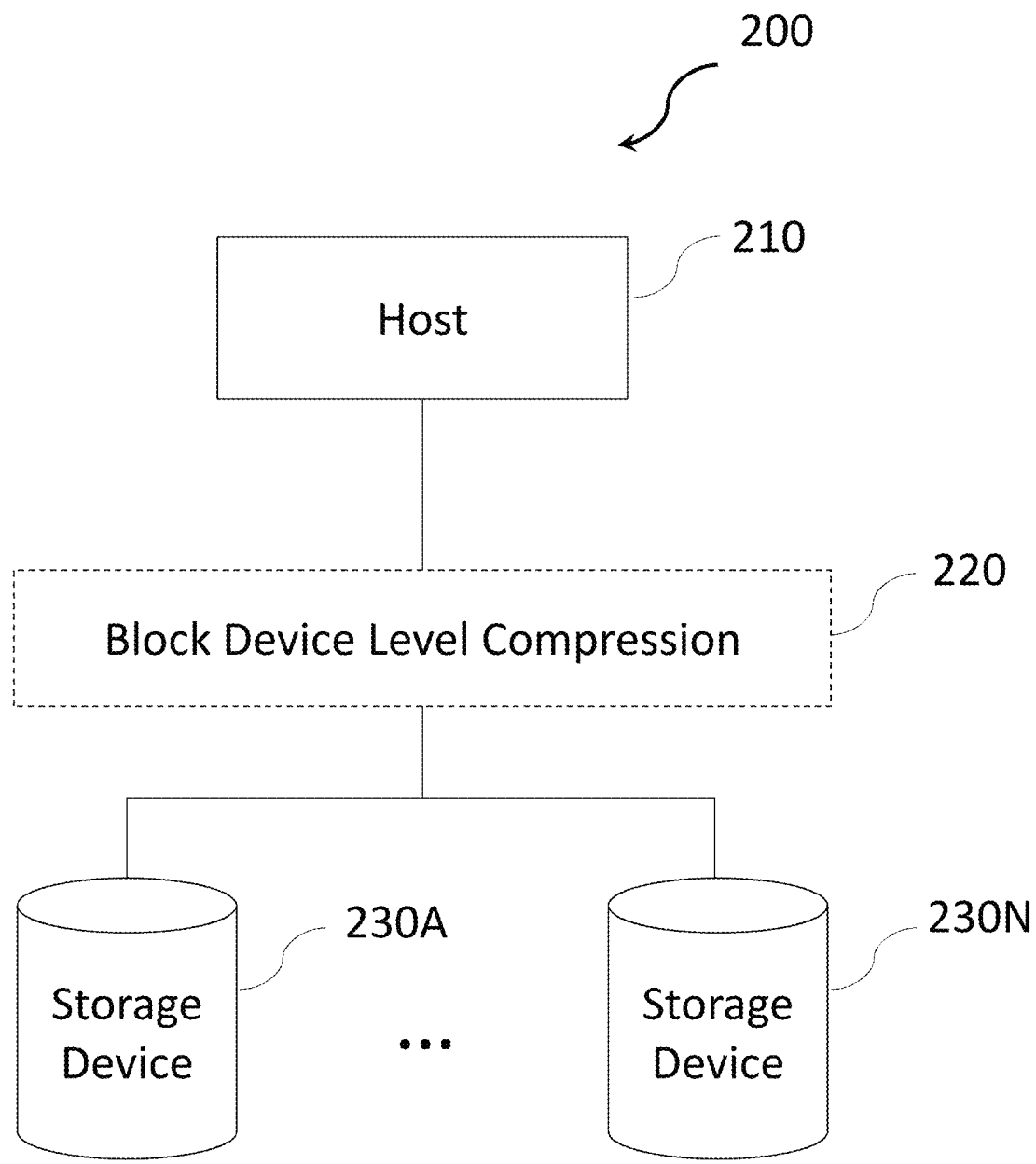
FIG. 2 is a schematic view of an example block storage device control system, arranged in accordance with at least some embodiments described herein.

FIG. 2 is a schematic view of an example control system 200, for example, a block storage device control system, for a storage device, arranged in accordance with at least some embodiments described herein.

The system 200 includes a host 210, a device level compression module 220, for example, a block device level compression module, and one or more storage devices 230A-230N. In an example embodiment, the host 210 may be the server 150 of FIG. 1. The storage devices 230A-230N may be block storage devices. Uncompressed block addresses (and/or uncompressed data) may be presented to and/or accessible from the host 210, and the compressed data may be stored in a space corresponding to the compressed block addresses for the storage devices 230A-230N. While the disclosure above is discussed with respect to block storage devices, such disclosure is not intended to be limiting, as the methods and systems described herein may be applied to other storage devices, such as, quantum storage or storage devices or other referencing data storage devices.

In an example embodiment, the operations of the block device level compression module 220 may be transparent to the host 210. That is, the host 210 operates, manipulates, reads, writes, stores, or otherwise accesses the uncompressed data (and/or the uncompressed block addresses) with the storage devices 230A-230N via the block device level compression module 220, e.g., without any visible affect by the user and/or the host on how the workload and/or data is mapped and/or compressed. That is, the host 210 may not be aware of the block device level compression module 220 (1) compressing the uncompressed data to the compressed data, (2) mapping the uncompressed block address to a compressed block address, (3) storing the compressed data in a space corresponds to the compressed block addresses for the storage devices 230A-230N, (4) retrieving the compressed data from the storage devices 230A-230N, and/or (5) decompressing the compressed data to the uncompressed data.

For example, when the host 210 reads data from the storage devices 230A-230N, the host may receive the uncompressed data via the block device level compression module 220. When the host 210 writes data to the storage devices 230A-230N, the host 210 may send the uncompressed data to the block device level compression module 220.

In an example embodiment, the interface between the host 210 and the block device level compression module 220 and/or the interface between the storage devices 230A-230N and the block device level compression module 220 may be e.g., an interface that implements the nonvolatile memory express (NVMe) storage access and transport protocol. It is to be understood that the features of the embodiments disclosed herein may be implemented in the block device level compression module 220. In an example embodiment, the block device level compression module 220 may include one or more components of a computer system 1200 (shown in FIG. 12, discussed below). In an example embodiment, the block device level compression module 220 may include the storage devices 230A-230N. In an example embodiment, the block device level compression module 220 may be in a form of a computer card or the like. As used herein, the term compressed data refers to any level of compression of the data including zero compression, e.g., uncompressed data.

That is, in some embodiments, the block device level compression module 220 may include non-compressible data.

In an example embodiment, the block device level compression module 220 may be configured to divide an uncompressed data space that is visible or used by the host 210 into a plurality of partitions for receiving the workload from the host 210 or providing uncompressed data to the host 210. The block device level compression module 220 may also be configured to divide a compressed data space on the storage devices 230A-230N into a plurality of storage segments (e.g., defrag units). In an embodiment, the block device level compression module 220 may be configured to assign the plurality of defrag units as being segment defrag unit(s) for a segment zone for serving the segment mapping mode or a hash defrag unit(s) for a hash zone for serving the hash mapping mode. In some embodiments, the plurality of defrag units may correspond to (and/or represent) actual blocks and/or addresses on the physical storage device, but provided virtually in memory, e.g., during runtime, for mapping thereto.

In some embodiments, at runtime, the block device level compression module 220 may assign one or more of the plurality of defrag units to at least one partition of the plurality of partitions and dynamically manage storage of the data on the storage device by dynamically switching between storing data on different defrag units of the plurality of defrag units assigned to the plurality of partitions. After the mapping of the data has been completed, the data may be stored on the storage device, e.g., write process. In an embodiment, the dynamic or adaptive mapping of the data may be based on the data request pattern of the workload, e.g., I/O request pattern. As used herein, the defrag units may include the segments as discussed above with respect to a memory page or group of portions of the memory page. As used herein, data may be the workload, data for addressing the workload, e.g., LBA, or any combination thereof.

In an embodiment, the block device level compression module 220 may be further configured to dynamically reallocate usage of the data space storing the data on the plurality of defrag units via a data reallocation and/or garbage collection mechanism, by performing at least one of: defragmentation and/or data reallocation, expanding a number of defrag units assigned to at least one partition of the plurality of partitions; compacting the number of defrag units assigned to the plurality of partitions; and shrinking the number of assigned to the at least one partition. As such, at least because the defrag units are smaller data spaces, the defragmentation and/or data reallocation, expansion, compaction, and/or shrinkage of the segments, e.g., defrag units, the data capacity management may be efficiently managed and not computationally intensive, e.g., only certain segments or defrag units may be defragmented and/or data reallocated, moved, reassigned, etc.

Figure 3:
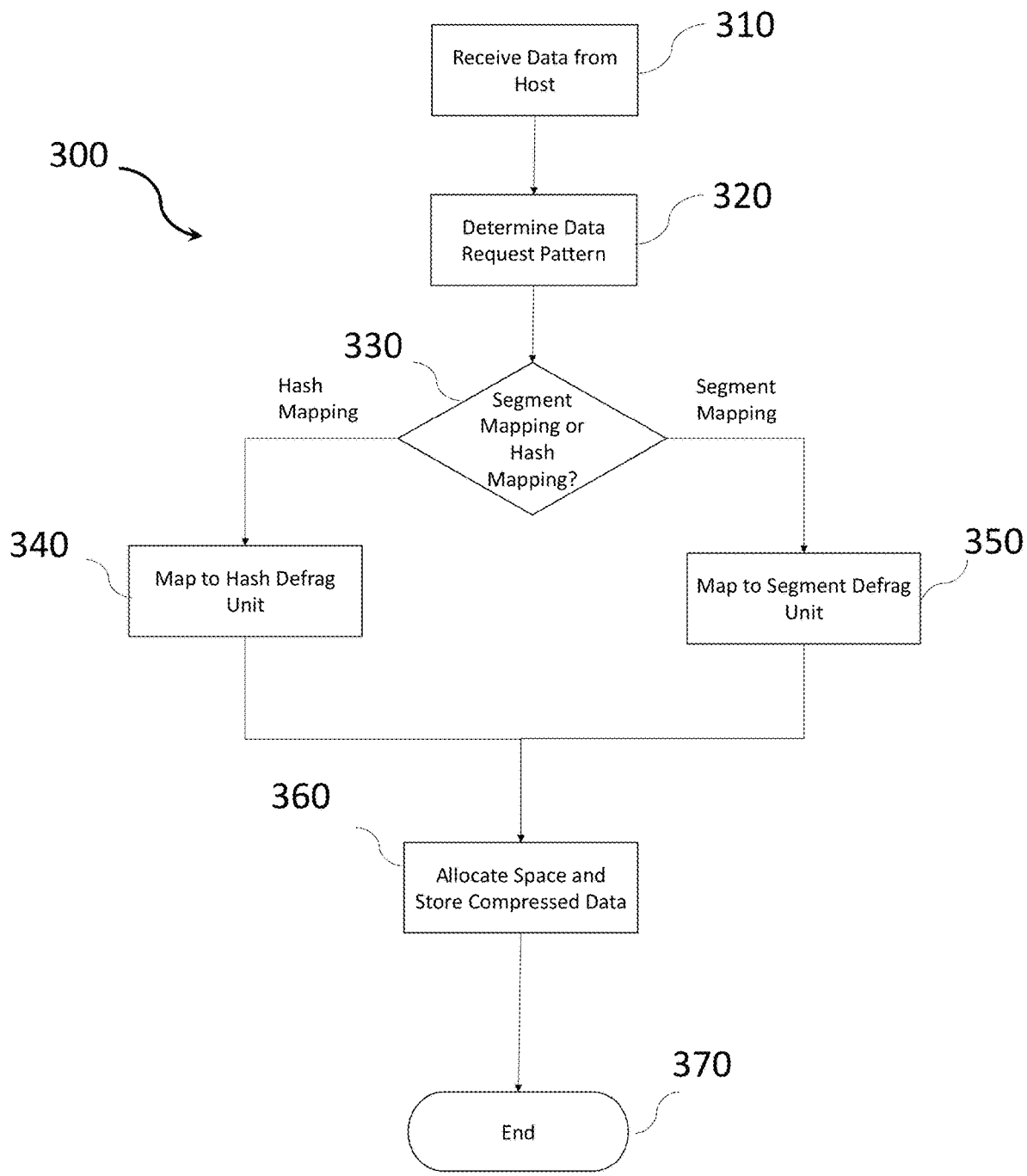
FIG. 3 is a flow chart illustrating an example adaptive mapping scheme, in accordance with at least some embodiments described herein.

FIG. 3 is a flow chart illustrating an example write processing flow 300 of block device level compression using adaptive mapping, in accordance with at least some embodiments described herein.

Figure 12:
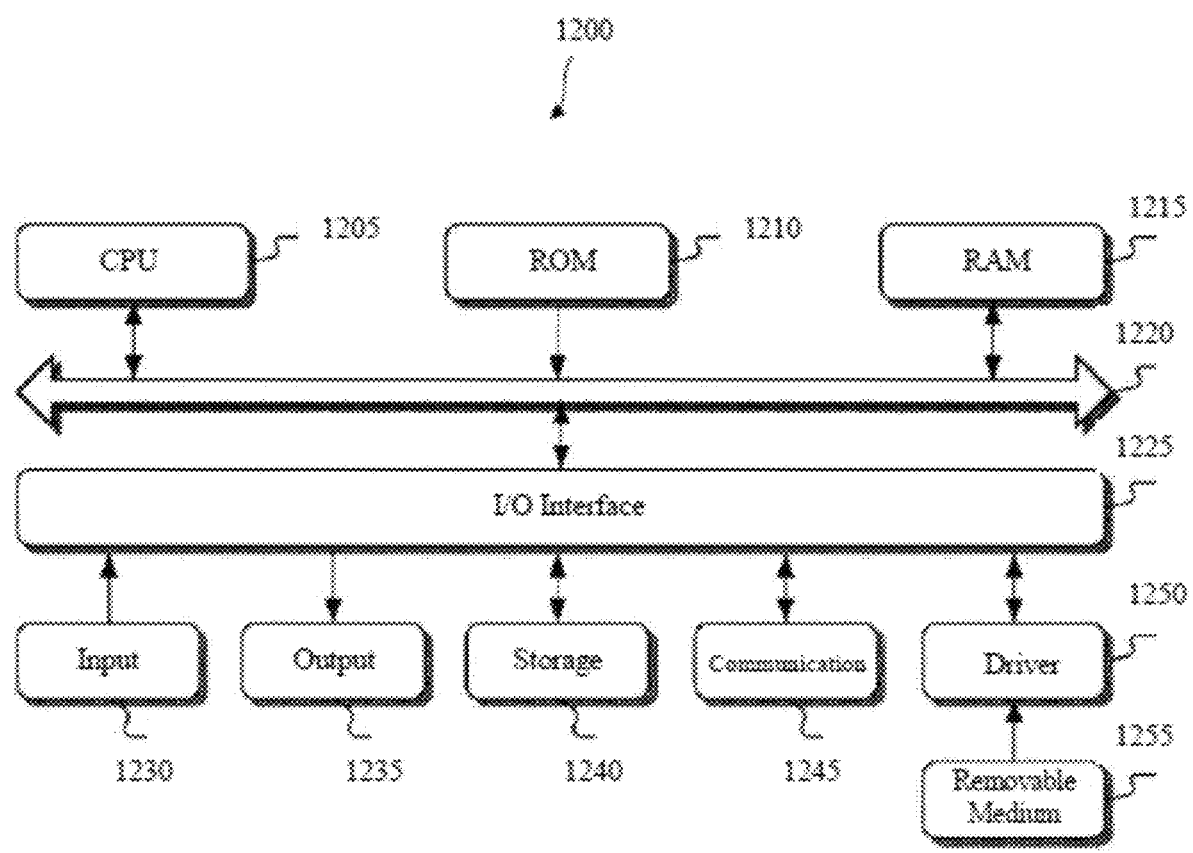
FIG. 12 is a schematic structural diagram of an example computer system applicable to implementing an electronic device, arranged in accordance with at least some embodiments described herein.

It is to be understood that the processing flow 300 disclosed herein can be conducted by one or more processors (e.g., the processor of one or more of the terminal device 110, 120, 130, and 140 of FIG. 1, the processor of the server 150 of FIG. 1, the central processor unit 1205 of FIG. 12, a processor of the block device level compression module 220 of FIG. 2, and/or any other suitable processor), unless otherwise specified.

It is also to be understood that the processing flow 300 can include one or more operations, actions, or functions as illustrated by one or more of blocks 310, 320, 330, 340, 350, 360, and 370. These various operations, functions, or actions may, for example, correspond to software, program code, or program instructions executable by a processor that causes the functions to be performed. Although illustrated as discrete blocks, obvious modifications may be made, e.g., two or more of the blocks may be re-ordered; further blocks may be added; and various blocks may be divided into additional blocks, combined into fewer blocks, or eliminated, depending on the desired implementation. It is to be understood that before the processing flow 300, operations including initializations or the like may be performed. For example, system parameters and/or application parameters may be initialized, the hash mapping table, e.g., 422B of FIG. 4 (and/or the overflow bitmap) and the segment mapping table, e.g., 422A (and/or the metadata bitmap) of FIG. 4, may be populated (e.g., from the metadata on the block storage device and/or update journal after power loss) into the memory and/or maintained in memory at runtime, etc. It is also to be understood that the data to be stored or written (the uncompressed data) and/or the uncompressed block address may be received from the host (e.g., the server 150 of FIG. 1). The processing flow 300 may be transparent to the host and/or the application (that requests the write process) that is run on the host.

Processing flow 300 may begin at block 310. It is to be understood that block 310 may be performed any time before block 360, block 310 and block 320 can be performed any time before block 330. Blocks that do not have dependencies may be performed in series or in parallel at any time.

At any time before block 310 or during the processing flow 300, the processor may be configured to divide a space on the storage device, e.g., compressed space, into a plurality of segments or units, e.g., defrag units, (referred to herein as defrag units) for storing data. The dividing of the space may be a virtual space of the storage device provided during runtime, e.g., on RAM. The plurality of defrag units in the virtual space may correspond to the actual space on the storage device, e.g., for addressing and writing on the actual storage device. In an embodiment, the processor may be configured to assign the plurality of defrag units as being one or more of a segment defrag unit for a segment zone for serving the segment mapping mode or a hash defrag unit for a hash zone for serving the hash mapping mode, for example, during runtime and/or based on the I/O request pattern, e.g., sequential write or random write and/or size of the workload. For example, during a sequential write of a large workload, a first segment defrag unit from a plurality of defrag units assigned to a segment zone may be assigned to the partition receiving the workload and/or uncompressed LBA. As the assigned segment defrag unit becomes full, a second segment defrag unit may be assigned to the partition for further mapping of the workload and/or a defrag unit may be reassigned from a hash defrag unit to a segment defrag unit, or vice versa. In another embodiment, during a random write of a workload, a first hash defrag unit from a plurality of defrag units assigned to a hash zone may be assigned to the partition receiving the workload and/or uncompressed LBA. As the assigned hash defrag unit becomes full, a second hash defrag unit may be assigned to the partition for further mapping of the workload and/or a defrag unit may be reassigned from a segment defrag unit to a hash defrag unit, or vice versa. That is, the processor may be configured to assign the plurality of defrag units as being at least one of the segment defrag unit or the hash defrag unit and then dynamically assigning and/or reassigning the plurality of defrag units as being the segment defrag unit or the hash defrag unit at runtime, based on the needs of the system. In some embodiments, the dynamically reassigning the plurality of defrag units may include reclaiming defrag units during memory management at runtime. In yet some other embodiments, the processor may be configured to assign the plurality of defrag units to further include free or unused defrag units, e.g., not assigned to either the segment zone or the hash zone, and using the free or unused defrag units as a segment defrag unit and/or hash defrag unit.

In some embodiments, the processor is also configured to divide the uncompressed space that is visible and used by the host into a plurality of partitions. For example, the uncompressed LBA space may be divided into a plurality of partitions having, for example, a 16 GB size. The plurality of partitions of the LBA space may be used for receiving the incoming data, e.g., workload and/or uncompressed LBA. The partition receiving the data may be considered an active partition, e.g., partition that has data to be processed.

At block 310 (Receive Data from Host), the processor may receive data from the host, e.g., host 210 of FIG. 2. That data may be uncompressed data and/or the processor may compress the data to be stored (the workload or any other uncompressed data of the host's write request) to compressed data e.g., using a compression algorithm or the like, in which uncompressed data may be compressed data at zero or no compression. In some embodiments, the data may be uncompressible, e.g., due to data type. That is, compression of the data and/or workload is optional, in which the adaptive mapping and/or efficient data capacity management as discussed herein may be used for uncompressed and/or compressed data. In some embodiments, the processor may determine the current mapping of the data. For example, in some embodiments, the processor may obtain or receive the uncompressed LBA or segment or segment number of the workload, determine the entry or entries (e.g., one SMT entry or multiple/eight HMT entries, having a size of 8 B or the like) of the mapping table, e.g., 422 of FIG. 4 using the uncompressed LBA or segment or segment number of the workload as the index of the mapping table 422, and determine the current mapping or status of the entry or entries of the mapping table 422. In an example embodiment, the current mapping or status of an entry can be a no-mapping, a segment mapping (using the segment mapping mode), or a hash mapping (using the hash mapping mode).

It is to be understood that the processor may determine whether the current status of the entry is the no-mapping. An empty or zero entry of the mapping table 422 may indicate that there is no-mapping for such entry. That is, all fields of such entry of the mapping table 422 may be zero. It is also to be understood that for an empty block storage device (e.g., prepared for its first use), all entries of the mapping table 422 may be empty (e.g., initialized as zeros, etc.) indicating that no uncompressed block address is mapped to any compressed block address. The existence of a mapping is indicated by a non-empty or non-zero entry of the mapping table 422.

It is further to be understood that when there is a mapping, the processor may determine whether the current status of the entry is the segment mapping or the hash mapping by checking the SSBM bit/flag (see 423, described below in detail) corresponding to the entry. When the corresponding SSBM bit is set, the current status of the entry is the segment mapping. When the corresponding SSBM bit is cleared, the current status of the entry is the hash mapping. Processing may proceed from block 310 to block 320.

At block 320 (Determine Data Request Pattern), the processor may be configured to determine a data request pattern of a workload for storing on the storage device, e.g., uncompressed data received by the host, e.g., host 210 of FIG. 2. The data request pattern may be an I/O request pattern of the workload from the host. The I/O request pattern of the workload may be obtained or received from the host, e.g., user entered I/O request pattern via an API. In an example embodiment, the I/O request pattern may be a segment (e.g., 32 KB or the like) aligned write. Such pattern may be referred to as a sequential pattern. In an example embodiment, the I/O request pattern may be a 8 KB-16 KB write (e.g., a 8 KB, 12 KB, or 16 KB write, for 4 KB blocks), or a 4 KB write. Processing may proceed from block 320 to block 330.

At block 330 (Segment Mapping or Hash Mapping?), after the processor determines the data request pattern of the workload, the processor may be configured to assign at least one of a segment defrag unit from a plurality of defrag unit assigned to a segment zone for serving the segment mapping mode or a hash defrag unit from a plurality of defrag units assigned to a hash zone for serving the segment mapping mode to the active partition. In some embodiments, the processor may be configured to assign at least both a segment defrag unit and a hash defrag unit to the active partition. The processor may then be configured to perform adaptive mapping (to dynamically switch between the segment mapping mode and the hash mapping mode) based on the determined I/O request pattern and/or the current status of the entry (of the mapping table), for example, as disclosed in U.S. application Ser. No. 18/163,612, filed Feb. 2, 2023, which is incorporated by reference.

In an example embodiment, when the current mapping or current status is the no-mapping, and the I/O request pattern is a sequential pattern (segment/32 KB aligned write), the processor may use the segment mapping mode. It is to be understood that the starting address of the SMT entry may be determined based on e.g., available compressed space that may accommodate the compressed data (the compressed workload) using a desired allocation mechanism. In another example embodiment, when the current mapping or current status is the no-mapping, and the I/O request pattern is a random pattern (8 KB-16 KB write or 4 KB write), and if the workload is at beginning of a segment, the processor may use the segment mapping mode. In yet another example embodiment, when the current mapping or current status is the no-mapping, and the I/O request pattern is a random pattern (8 KB-16 KB write or 4 KB write), and if the workload is not at beginning of a segment, the processor may use the hash mapping mode. In yet another example embodiment, when the current mapping or current status is the segment mapping, and the I/O request pattern is a sequential pattern (segment/32 KB aligned write), the processor may use the segment mapping mode. In yet another example embodiment, when the current mapping or current status is the segment mapping, and the I/O request pattern is a random pattern (8 KB-16 KB write or 4 KB write), and if the workload is appending to an open segment (by checking the uncompressed LBA of the workload and the ending uncompressed LBA of the open segment), the processor may use the segment mapping mode. In yet another example embodiment, when the current mapping or current status is the segment mapping, and the I/O request pattern is a random pattern (8 KB-16 KB write or 4 KB write), and if the workload is not appending to an open segment (by checking the uncompressed LBA of the workload and the ending uncompressed LBA of the open segment), the processor may use the hash mapping mode. In yet another example embodiment, when the current mapping or current status is the hash mapping, and the I/O request pattern is a sequential pattern (segment/32 KB aligned write), the processor may use the segment mapping mode. In yet another example embodiment, when the current mapping or current status is the hash mapping, and the I/O request pattern is a random pattern (8 KB-16 KB write), the processor may split the workload to 4 KB portions, and may use the hash mapping mode. In yet another example embodiment, when the current mapping or current status is the hash mapping, and the I/O request pattern is a random pattern (4 KB write), the processor may use the hash mapping mode.

It is to be understood that in the embodiments disclosed herein, the entry of the mapping table 422 may be adjusted (e.g., created, converted to other entry/entries, overwritten, updated, etc.) based on the I/O request pattern, and/or the current status of the entry, and/or by the host via an API that is specified by the user, or the like. Processing may proceed from block 330 to block 340 and/or 350.

At block 340 (Map to Hash Defrag Unit), when the data request pattern of the workload is determined to use the hash mapping mode, the processor is configured to store and/or map the data, e.g., workload data and/or mapping data, on/to at least one of the plurality of hash defrag units assigned from the hash zone. In an embodiment, the processor is configured to use the HMT 422B of FIG. 4 for mapping the data, e.g., uncompressed LBA, to the hash defrag unit(s) as a mapped virtual compressed LBA for the storage device. The virtual compressed LBA may include uncompressed LBA offset in the hash defrag unit, e.g., segmented address in the defrag unit that have already been used/written, and/or offset based on the start of the LBA of the defrag unit on the actual storage device, e.g., disk. In some embodiments, the hash mapping mode may directly map to the actual storage device, e.g., storage address on disk.

At block 350 (Map to Segment Defrag Unit), when the data request pattern is for the segment mapping mode, the processor is configured to store the data, e.g., workload data and/or mapping data, from the active partition on at least one of the plurality of defrag units assigned as the segment defrag unit. In an embodiment, the processor is configured to use the SMT 422A of FIG. 4 for mapping the data, e.g., uncompressed LBA, to the segment defrag unit(s) as a mapped virtual compressed LBA for the storage device. The virtual compressed LBA may include uncompressed LBA offset in the segment defrag unit, e.g., segmented address in the defrag unit that have already been used/written, and/or offset based on the start of the LBA of the defrag unit on the actual storage device, e.g., disk. In some embodiments, the segment mapping mode may directly map to the actual storage device, e.g., storage address on disk.

In some embodiments, the processor may be configured to dynamically switch between storing the data on the segment defrag unit and/or storing the data on the hash defrag unit based on the determined data request pattern, e.g., during sequential write. In some embodiments, the dynamically switching includes switching to the storing the data on the segment defrag unit when the determined data request pattern is the sequential pattern; and switching to the storing the data on the hash defrag unit when the determined data request pattern is the random pattern.

Processing may proceed from block 340 and/or 350 to block 360. At block 360 (Allocate Space and Store Compressed Data), the processor may allocate a space, e.g., actual space on the disk, for the defrag unit, e.g., at least one of the hash defrag unit and/or the segment defrag unit, that corresponds to the virtual compressed LBA mapped from the uncompressed LBA/segment. It is to be understood that the space may be allocated at Block 330 when the mapping (from the uncompressed LBA/segment to the compressed LBA) is determined. That is, when performing the adaptive mapping to determine the starting address (and the total length) for the SMT entry or determine the hash function for the HMT entry/entries, the starting address (and the total length) or the hash function may be determined, e.g., with an offset (e.g., based on any in-partition LBA offset and/or any uncompressed LBA offset) on the defrag unit, so that there is a mapping to a compressed block address in the actual block storage device for the compressed data, e.g., the compressed address on the block storage device being the start of the LBA of the defrag unit on the block storage device combined with the offset (e.g., based on the uncompressed LBA offset, etc.) in the defrag unit. The processor may also store or write the compressed (or uncompressed) data (from block 310) to the mapped compressed block address (derived from or corresponding to the fields in the SMT entry or FHT entry/entries combined with the offset (e.g., based on any in-partition LBA offset and/or uncompressed LBA offset) in the defrag unit. Processing may proceed from block 360 to block 370.

At block 370 (End), the processor may end the write processing flow 300 and/or report to the host that the write process is completed.

While the write processing flow 300 of block device level compression using adaptive mapping of FIG. 3 has been discussed having blocks 310, 320, 330, 340, 350, 360, and 370, it is understood that additional blocks or functions may also be included. For example, in some embodiments, the processor may be configured to further dynamically assign the segment defrag unit and the hash defrag unit based on the determined I/O request pattern by at least one of assigning at least one unused defrag unit as an additional segment defrag unit when the determined data request pattern is the sequential pattern; and assigning at least one unused defrag unit as an additional hash defrag unit when the determined data request pattern is the random pattern, e.g., from the plurality of defrag units assigned to the segment zone, or hash zone, or free or unused zone.

As such, depending on the characteristics of the workload, e.g., compressibility, and/or characteristics of the partition and/or defrag unit, e.g., usage, the compressed data space may be efficiently managed by assigning/allocating the compressed data space as segment defrag unit(s) and/or hash defrag unit(s) at runtime. For example, in an embodiment, when the workload that is mapped to the active partition has a low compression ratio, e.g., movie or video with less than 10% compressibility, at least one second defrag unit is assigned to the active partition. In some embodiments, if additional segment defrag units and/or hash defrag units are needed for the mapping and/or storage of the data, prior assigned segment defrag units and/or hash defrag units may be reassigned and/or reallocated to the other respective zone, e.g., a prior assigned segment defrag unit from the segment zone reassigned to the hash zone.

Figure 4:
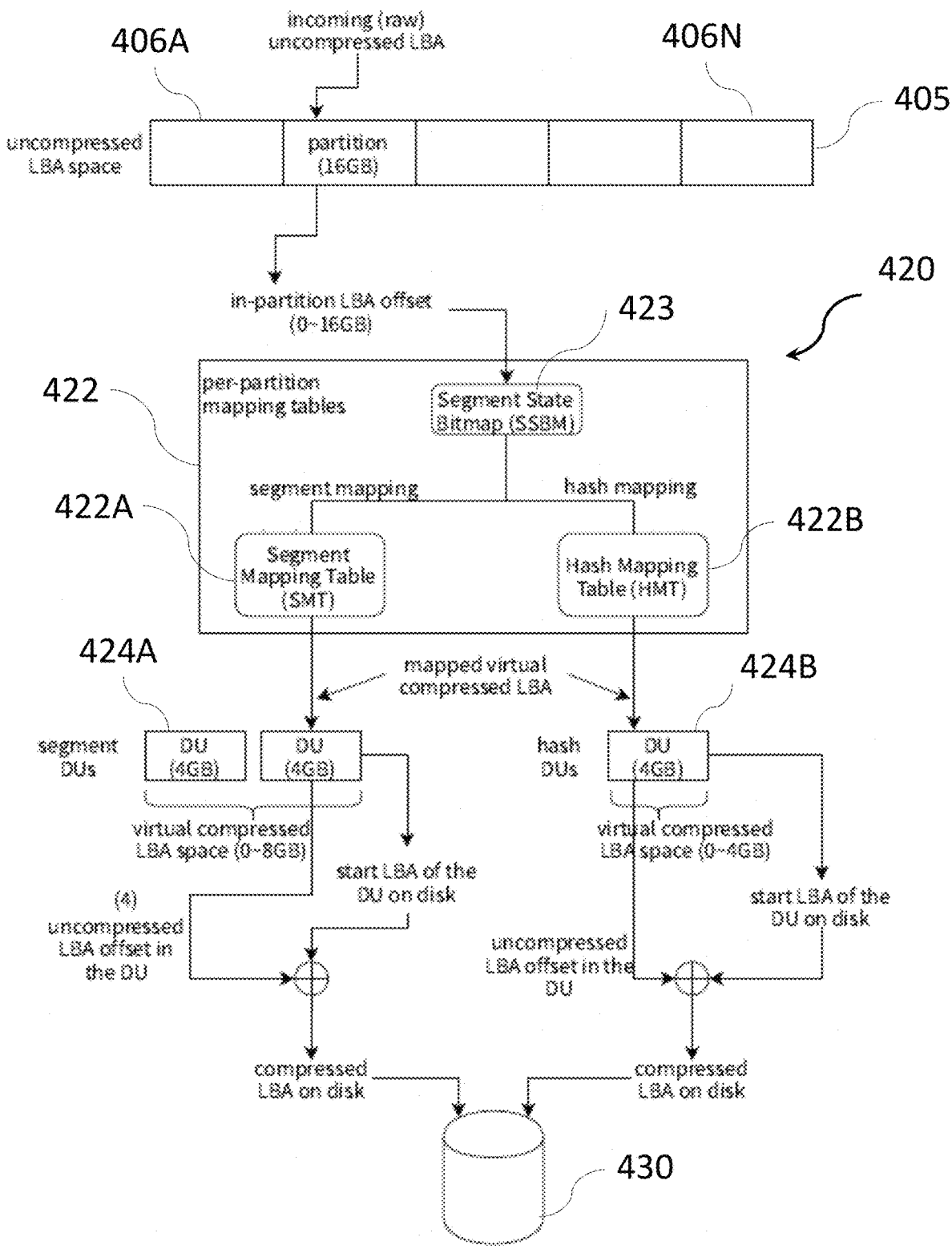
FIG. 4 is a schematic view of an example storage management and mapping sub-system, arranged in accordance with at least some embodiments described herein.

FIG. 4 is a schematic view of an example storage management and mapping sub-system 420, arranged in accordance with at least some embodiments described herein. In an example embodiment, the sub-system 420 may be a part of and/or accessible by the block device level compression module 220 of FIG. 2 and/or the control system 200 of FIG. 2.

In an embodiment, the control system, e.g., 200 of FIG. 2, may include a storage device and/or storage device control system that includes an uncompressed logical block address (LBA) space 405 for receiving incoming (or raw) uncompressed and/or uncompressible data, e.g., workload and/or LBA, for example, from the host, e.g., 210 of FIG. 2, the sub-system 420, a partition mapping table 422, a plurality of defrag units or segments 424A, 424B, and storage device(s) 430, which may be the same as storage devices 230A, 230N of FIG. 2. In an example embodiment, the control system, e.g., 200 of FIG. 2, may be configured to divide the uncompressed LBA space into a plurality of partitions 406A, 406N. As such, the incoming uncompressed data from the host is received by at least one of the partitions 406A, 406N in the uncompressed LBA space 405, e.g., active partition. In an embodiment, the partitions may be divided into 16 GB partition sizes. It is appreciated that the size of the partitions is not intended to be limiting, but given as an example, and other partition sizes may also be used, e.g., 2 GB, 4 GB, 8 GB, 32 GB, 64 GB, 128 GB, 256 GB, etc.

In an embodiment, the control system 200 and/or the sub-system 420 may be configured to divide a space on the storage device, e.g., compressed space, into a plurality of segments or units, e.g., defrag units 424A, 424B, (referred to herein as defrag units) for storing data. The dividing of the space may be a virtual space on the storage device provided during runtime, e.g., on RAM. The plurality of defrag units 424A, 424B in the virtual space may correspond to the actual space on the storage device, e.g., for addressing and writing on the actual storage device. The defrag units 424A, 424B may be assigned to a segment zone for segment defrag unit(s) 424A for receiving, storing, and/or serving a segment mapping mode or assigned to a hash zone for hash defrag unit(s) 424B for receiving, storing, and/or serving a hash mapping mode, for example, a flat hash mapping mode, and/or may be assigned to a free or unused zone for free or unused defrag unit(s) in a pool of defrag units e.g., for overflow data, e.g., for the incoming data and their uncompressed LBA, and/or for use during reallocation of non-used data space, e.g., garbage collection and/or defragmentation. The assignment of the defrag units 424A, 424B as either a segment defrag unit that serves the segment zone or a hash defrag unit that serves the hash zone or as an unused defrag unit may be stored as metadata as a list on the storage device or disk, and may be persistent data, e.g., maintained in memory at runtime. The defrag units 424A, 424B may have a block size of ¼ the size of the partition 406A, 406N of the uncompressed LBA space 405, e.g., 4 GB. It is appreciated that the size of the defrag units is not intended to be limiting, but given as an example, and other sizes smaller than the partition size may be used.

The sub-system 420 may include the partition mapping tables 422 having a segment mapping table 422A and/or a hash mapping table 422B. In an embodiment, the partition mapping tables 422 may be a single mapping table for all of the partitions 406A, 406N in the uncompressed LBA space 405 or a single partition mapping table 422 for each of the partitions 406A, 406N, e.g., per-partition mapping table. In an embodiment, the partition mapping table 422 may be single table shared by a segment mapping mode and a hash mapping mode or separate tables for the segment mapping mode and the hash mapping mode. In an example embodiment, the partition mapping table 422 is an in-memory table. That is, the partition mapping table 422 may be populated from the metadata on the block storage device and maintained in memory at runtime. The partition mapping table 422 may include the assignment of the plurality of defrag units as being in the segment zone, the hash zone, and/or the free or unused zone.

It is to be understood that embodiments disclosed herein may adapt to the workload's read/write (or I/O) pattern (i.e., the host's read/write or I/O request pattern) and determine and/or map the uncompressed data, e.g., LBA, from the active partition to the corresponding defrag unit(s) in the compressed LBA space. For example, in an embodiment, the sub-system 420 or control system 200 may be configured to determine the data request pattern, e.g., I/O request pattern, and determine whether the segment mapping mode and/or the hash mapping mode is needed for mapping/storing the determined I/O request pattern. In an example embodiment, the I/O request pattern may be a segment (e.g., 32 KB or the like) aligned write. Such pattern may be referred to as a sequential pattern and the segment mapping mode may be used to map the uncompressed LBA to segment defrag unit(s) 424A. In an example embodiment, the I/O request pattern may be a 8 KB-16 KB write (e.g., a 8 KB, 12 KB, or 16 KB write, for 4 KB blocks), or a 4 KB write. Such pattern may be referred to as a random pattern and the hash mapping mode may be used to map the uncompressed LBA to hash defrag unit(s) 424B.

In an embodiment, the control system 200 and/or sub-system 420 may be configured to assign to the active partition at least one of a segment defrag unit 424A from the segment zone for serving the segment mapping mode and/or a hash defrag unit 424B from the hash zone for serving the hash mapping mode, for example, during runtime and/or based on the I/O request pattern, e.g., sequential write or random write and/or size of the workload. As such, when the segment mapping mode is selected for the workload from the active partition, the mapping table 422 or segment mapping table (SMT) 422A may be indexed by the segment number of the uncompressed data that are presented to and/or accessible by the host 210 of FIG. 2. In an example embodiment, each segment or segment number of the uncompressed data may contain or store 32 KB data (e.g., eight 4 KB blocks). Each uncompressed logical block address (LBA) may correspond to a space containing or storing 4 KB data. When the segment mapping mode is used, the mapping table 422 or SMT 422A may include a plurality of segment mapping table (SMT) entries. That is, each segment (or segment number) may correspond to an SMT entry. Each SMT entry may have a size of 8 B (or other suitable size).

In an example embodiment, each SMT entry (e.g., having a size of 8 B or the like) may include at least one of an open flag, a reserved field, a total length field, a first length field (len0), a second length field (len1), a third length field (len2), a fourth length field (len3), a fifth length field (len4), a sixth length field (len5), a seventh length field (len6), or a starting address field. The SMT entry is used to map the uncompressed LBA (or the corresponding segment) to the compressed LBA in the block device 430 (the compressed LBA space), e.g., the actual storage of the defrag units 424A, 424B on the disk. It is to be understood that one or more of the first length field (len0), the second length field (len1), the third length field (len2), the fourth length field (len3), the fifth length field (len4), the sixth length field (len5), and the seventh length field (len6) may be optional.

In an example embodiment, the open flag can have a size of 1 bit. The open flag is configured to indicate whether the segment (that corresponds to the SMT entry) is open or closed. If the open flag is set, then the segment is "open" or being filled up (e.g., by the host 210 of FIG. 2). For an open segment, the compressed size of the segment is unknown yet. Therefore, a 32 KB compressed LBA space (equal to the size of the segment or the size of the maximum uncompressed data in the segment) may be allocated for the open segment to ensure enough space as the open segment being filled up (e.g., by the host 210 of FIG. 2). Once the segment is filled up, its open flag may be cleared, and any remaining or unused compressed LBA space allocated for the segment may be released.

In an example embodiment, the starting address field includes the starting address (of the compressed data corresponding to or mapped from the uncompressed data in the segment) in the compressed LBA space, e.g., the starting address of the defrag units 424A, 424B on the disk. The total length field includes a total length (in 1 KB units) of the compressed data corresponding to or mapped from the uncompressed data in the segment. The first length field (len0) to the seventh length field (len6) include lengths (i.e., the first length to the seventh length, in 1 KB units) of each compressed block. It is to be understood that for a segment (eight uncompressed blocks), there can be up to eight compressed blocks, and the length for the eighth compressed block can be determined based on the total length and the first through the seventh length. In an example embodiment, the SMT is an in-memory table. That is, the SMT is populated from the metadata on the block storage device and maintained in memory at runtime.

In an example embodiment, when the hash mapping mode is selected, the mapping table 422 or hash mapping table (HMT) 422B may be indexed by the uncompressed logical block addresses (LBAs) of the uncompressed data that are presented to and/or accessible by the host 210 of FIG. 2 and mapped to the hash defrag unit(s) 424B. The hash table may include a plurality of entries. The number of entries may be equal to the number of the uncompressed block addresses. In an example embodiment, each uncompressed logical block address may correspond to a space containing or storing 4 KB data. When the hash mapping mode, and in particular, a flat hash table mapping mode, is used, the mapping table 422 or HMT 422B may include a plurality of flat hash table (FHT) entries. Each FHT entry may have a size of 1 B (or other suitable size). Each FHT entry includes a hash function index field that contains a hash function index and a usage bitmap field that contains a usage bitmap. It is to be understood that the hash function index of the FHT entry indicates which hash function (in a set of hash functions) may be used for mapping the uncompressed LBA to a compressed LBA. It is also to be understood that a compressed block allocation table may be used in the hash mapping mode. In an example embodiment, a size of the hash function index field is 4 bits. A size of the usage bitmap field is 4 bits.

In an example embodiment, the hash mapping mode, e.g., flat hash table mapping mode, uses a set of hash functions (or one hash function with multiple configurations, etc.), and a compressed block allocation table and configured to translate an incoming uncompressed logical block address (LBA) into a compressed LBA in the hash defrag unit(s) 424B on the storage device, e.g., disk. In an example embodiment, the hash table, which may be a flat hash table, and the compressed block allocation table are in-memory tables. That is, the hash table and the compressed block allocation table are populated from the metadata on the block storage device and maintained in memory at runtime.

It is to be understood that the hash function index indicates which hash function (in a set of hash functions) is used for mapping the uncompressed block address (which is used as the index of the entry of the hash table) to a compressed block address, e.g., of the hash defrag unit 424B. If the hash function index is 0 or empty, no mapping is configured. In an example embodiment, up to 15 hash functions may be supported (when a size of the hash function index field is 4 bits).

It is also to be understood that a set of hash functions may be provided. In an example embodiment, the set of hash functions may be pre-defined. The set of hash functions may be provided by or implemented on hardware and/or software. In an example embodiment, the set of hash functions is implemented on a dedicated hardware (e.g., using a physical device and/or electronic circuit as opposed to being done by a computer program) to increase the speed and to lower the energy consumption compared with the software implementation. The set of hash functions may be implemented as (1) a set of different hash functions, or (2) by using one hash function with a plurality of (different) configurations, or (3) a combination of the two implementations. It is to be understood that the requirement for the set of hash functions is that the set of hash functions may generate different mappings from the uncompressed block address space to the compressed block address space. In some example embodiments, the set of hash functions may include a Pearson hashing/hash function, a Fowler-Noll-Vo hash function, and/or a PJW (Peter J. Weinberger) hash function.

It is further to be understood that the index of the set of hash functions may be used as the hash function index of the entry of the hash table. That is, the value of the hash function index in the hash table may correspond to the index of the hash function in the set of hash functions (or the index of the configuration of the hash function in the multiple configurations if one hash function with multiple configurations is used). For example, when the hash function index is one, the first hash function in the set of hash functions (or the hash function with the first configuration) may be used for mapping. When the hash function index is two, the second hash function in the set of hash functions (or the hash function with the second configuration) may be used for mapping. When the hash function index is N, the Nth hash function in the set of hash functions (or the hash function with the Nth configuration) may be used for mapping. When a hash function is executed, the hash function may take the uncompressed block address (i.e., the index of the hash table that corresponds to an entry of the hash table that contains the hash function index that corresponds to the hash function) as an input, and map the input to an output (i.e., the compressed block address of the compressed data to be stored in the block storage device). It is to be understood that when the hash function index is zero, it indicates that there is no mapping.

In yet another example embodiment, each entry of the hash table may include an "overflow" bit indicating whether the storage is overflowed (which may be addressed by e.g., using compressed block address linking or using an overflow area or space). In another example embodiment, an overflow bitmap separate from and/or independent to the hash table may be used to track the status of the overflow. It is to be understood that a bitmap may refer to a representation in which each item corresponds to one or more bits of information.

In some embodiment described herein, when adapting to the workload's read/write (or I/O) pattern, the sub-system 420 or control system 200 may be configured to also dynamically switch between the segment mapping mode and the hash mapping mode, as necessary, e.g., during sequential write/read. That is, in an example embodiment, the sub-system 420 or control system 200 may be configured to adapt to a workload's I/O pattern by dynamically switching between the segment mapping mode and the hash mapping mode, e.g., use SMT to track sequential mappings at 32 KB segment storage levels, and use HMT for tracking random mappings at 4 KB storage levels. If the I/O request is regarded as sequential, segment based mapping may be used. If the I/O request is regarded as random, its mapping may be converted to a flat hash table mapping. The SMT and HMT are designed to share the same memory region, hence there is no additional memory overhead. A segment mapping entry (e.g., an SMT entry) may take 8 bytes and be used for tracking the mapping of a 32 KB segment. A flat hash table mapping entry (FHT entry) can be 1 byte and be used for tracking the mapping of a 4 KB block. When a segment is converted to use a hash mapping mode, its SMT entry can be converted to eight FHT entries.

In either the segment mapping mode or the hash mapping mode or combination thereof, the workload (i.e., the uncompressed data that are presented to and/or accessible by the host 210 of FIG. 2) received by the active partition may be compressed (e.g., by the block device level compression module 220 of FIG. 2) and saved in the block device 430 during a write process. The compressed data in the block device 430 can be decompressed (e.g., by the block device level compression module 220 of FIG. 2) and sent to or received by the host 210 of FIG. 2 during a read process. As discussed herein, compressed data may include a zero compression or no compression and/or the compression may be optional.

In an example embodiment, the compressed block allocation table may be indexed by the compressed block addresses for the block storage device. The compressed block allocation table may include a plurality of entries. The number of entries is equal to the number of the compressed block addresses of the defrag unit(s) for the block storage device. That is, each compressed block address to the defrag unit(s) may correspond to an entry of the compressed block allocation table. Each entry of the compressed block allocation table may include an aggregated bitmap field that contains an aggregated bitmap.

In an example embodiment, each entry of the compressed block allocation table may include a "metadata" bit indicating whether there is metadata in a space corresponds to the compressed block address in the block storage device (e.g., to avoid or prevent unnecessary metadata reads). In another example embodiment, a metadata bitmap (instead of a metadata bit) separate from and/or independent to the compressed block allocation table may be used to track the status of the metadata. It is to be understood that a bitmap may refer to a representation in which each item corresponds to one or more bits of information.

In an example embodiment, the sub-system 420 and/or the control system, e.g., 200, may be used as follows.

After the uncompressed LBA space 405 has been divided into a plurality of partitions 406A, 406N, e.g., by the control system 200, the uncompressed LBA and/or workload from the host, e.g., 210, may be received in one of the partitions 406A, 406N, e.g., active partition. In some embodiments, the sub-system 420 or the control system 200 may also be configured to divide the compressed LBA space on the disk into the plurality of defrag units 424A, 424B. The plurality of defrag units 424A, 424B may be assigned into at least two zones, a segment zone for supporting or serving segment mapping, e.g., a segment mapping mode, and a hash zone for supporting or serving random mapping, e.g., a hash mapping mode. It is appreciated that in some embodiments, the compressed LBA space may be a virtual space on the storage device provided during runtime, e.g., on RAM. The plurality of defrag units in the virtual space may correspond to the actual space on the storage device, e.g., for addressing and writing on the actual storage device. As discussed above, it is also understood that a free or unused zone may also be used, in which defrag units are free to be used, reassigned, reallocated, by the sub-system 420 or control system 200, as needed. In some embodiments, the sub-system 420 or the control system 200 may be configured to dynamically allocate the plurality of defrag units as serving at least one of the segment zone or the hash zone at runtime, e.g., based on the I/O request pattern, during sequential write. In some embodiments, the defrag unit(s) 424A, 424B may be reallocated. For example, if a defrag unit is assigned in the segment zone as a segment defrag unit 424A, but is unused, the defrag unit may be reclaimed, e.g., reallocation of unused space or a garbage collection, and assigned or reallocated to any of the other zones.

When one of the partitions 406A, 406N of the uncompressed LBA space 405 receives the data having its uncompressed LBA from the host 210, the partition is considered an active partition, in which the data in the partition is to be processed, and the sub-system 420 (and/or the control system 200) is configured to assign at least one segment defrag unit 424A and at least one hash defrag unit 424B to the active partition. For example, in the embodiment illustrated in FIG. 4, at least two segment defrag units 424A are assigned to the active partition and form a virtual compressed LBA space having a 0-8 GB size. In some embodiments, at least one hash defrag unit 424B is assigned to the active partition and form a virtual compressed LBA space having a 0-4 GB size. The sub-system 420 (and/or the control system, e.g., 200) may then be configured to determine the data request pattern of the incoming uncompressed LBA. In an embodiment, the data request pattern may include an Input/Output (I/O) request pattern (referred to as I/O request pattern herein). In an example embodiment, the I/O request pattern may be a segment (e.g., 32 KB or the like) aligned write. Such pattern may be referred to as a sequential pattern and the segment mapping mode may be used to map the uncompressed LBA to segment defrag unit(s) 424A. In an example embodiment, the I/O request pattern may be a 8 KB-16 KB write (e.g., a 8 KB, 12 KB, or 16 KB write, for 4 KB blocks), or a 4 KB write. Such pattern may be referred to as a random pattern and the hash mapping mode may be used to map the uncompressed LBA to hash defrag unit(s) 424B. While the data request pattern has been described herein as an I/O request pattern, such disclosure is not intended to be limiting, and other request patterns may be used.

After, the sub-system 420 and/or the control system 200 has determined the I/O request pattern and the mapping needed for the I/O request pattern, the sub-system 420 may then be configured to map the uncompressed LBA using the segment mapping mode, e.g., segment mapping table 422A, and/or the hash mapping mode, e.g., hash mapping table 422B, based on the determined I/O request pattern to, e.g., a virtual compressed LBA. In some embodiments, the sub-system 420 may be configured to convert the determination of the I/O request pattern into a usage bitmap, e.g., segment state bitmap (SSBM) 423, and/or receive a signal of the determination of the I/O request pattern, e.g., from the control system 200, which may be used in the determination whether a segment mapping mode or a hash mapping mode should be used for mapping the uncompressed LBA to the compressed LBA space on the storage device.

When the segment mapping mode is used, the compressed LBA is virtually mapped to at least one segment defrag unit 424A. When the hash mapping mode is used, the compressed LBA is virtually mapped to at least one hash defrag unit 424B. The defrag units 424A, 424B form a virtual compressed LBA space for the associated mapping mode, in which the defrag units 424A, 424B correspond to actual defrag unit(s) or segments having compressed LBA addresses on the storage disk, e.g., for the write process of the workload or data on the actual disk. In some embodiments, in order to obtain the actual compressed LBA of the defrag unit(s) on the storage device, the processor may be configured to combine, e.g., add function, an offset (e.g., based on the uncompressed LBA offset, etc.) inside the defrag unit(s) 424A, 424B, e.g., based on where the data is written on the defrag unit, e.g., slivers or segments, and the start of the LBA of the defrag unit on the actual disk. That is, the compressed LBA on the storage device, e.g., disk, is calculated or determined as, the start of the LBA of the defrag unit 424A, 424B in addition to the offset inside the defrag unit 424A, 424B.

In some embodiments, an offset of the LBA may also be used and considered. For example, an in-partition LBA offset, e.g., 0-16 GB, for example, for indexing and/or addressing the block, may be present that is associated with the partition 406A, 406N and sent to the sub-system 420. In some embodiments, the in-partition LBA offset may be present if the partition has already been written on and the first four segments are full. As such, the LBA will be offset by four when receiving the next workload.

In an example embodiment, the sub-system 420, e.g., processor, may perform power loss protection to protect the integrity of the block device level compression mapping process. For example, the HMT 422B, the SMT 422A, any overflow bit or bitmap, the assignment of the defrag units in the segment zone or hash zone, and/or any metadata bit or bitmap need to be persistent so that during or after a power loss, the processor may preserve the status of the mapping and/or restore the correct mappings on next startup.

In an example embodiment, an "update journal" may be used for recording the updates to the HMT 422B, the SMT 422A, the overflow bit or bitmap, and/or the metadata bit or bitmap. The update journal may be power loss protected (e.g. by using a capacitor on the block device level compression module or computer card). Whenever the HMT 422B, the SMT 422A, the overflow bit or bitmap, and/or the metadata bit or bitmap is updated, the event is recorded in the "update journal". When the "update journal" becomes full or near full (e.g., the usage of the update journal is above a certain threshold), the current snapshot of the HMT 422B, the SMT 422A, the overflow bit or bitmap, and/or the metadata bit or bitmap may be written to or backed-up in the block storage device (e.g., a disk, etc.) to free up entries in the "update journal". The backup process may be performed in a progressive manner to minimize the impact on user's inputs/outputs. In the event of power loss, the mapping may be restored at the next power on by e.g., (1) reading or retrieving the snapshot of the HMT 422B, the SMT 422A, the assignment of the defrag units to the segment zone or hash zone, the overflow bit or bitmap, and/or the metadata bit or bitmap from the block storage device (e.g., the disk, etc.), and (2) replaying the events recorded in the "update journal" to restore the latest state of the HMT 422B, the SMT 422A, the overflow bit or bitmap, and/or the metadata bit or bitmap.

As discussed above, in the embodiments as disclosed herein, the systems and methods are directed to dynamically switching between at least two mapping modes to accommodate the read/write pattern at runtime and achieve higher performance by efficiently managing data capacity by dividing the space, e.g., compressed space, into a plurality of defrag units or segments and mapping to the defrag unit or segment based on the mapping mode. That is, in order to accommodate for some of the challenges of using the dynamic switching between at least two mapping modes, for example, the variation of the compressibility of data across the disk, the different mapping characteristics between the at least two mapping modes, e.g., segment mapping and hash mapping, which allocate space differently and may interfere with each other, and differences in data reallocation or garbage collection, some example embodiments are directed to at least one of managing the LBA space in partitions and defrag units assigned to the partitions and mapping modes to avoid mixed mapping modes/storing in each defrag unit so that the mapping/storing of the workload may not interfere with each other.

In an example embodiment, the uncompressed LBA space from the host may be divided into partitions, e.g., 16 GB. The compressed LBA space on the disk may also be divided into a plurality of defrag units, in which each defrag unit is ¼ the size of the uncompressed LBA partition, e.g., 4 GB. The defrag units may be assigned to at least two zones, a segment zone and a hash zone, which may be lists stored on the storage device or disk. The defrag units assigned in the segment zone are used during sequential mappings from uncompressed LBA partitions. The defrag units assigned in the hash zone are used during random mappings from uncompressed LBA partitions. In some embodiments, the defrag units may be allocated dynamically at runtime between the segment zone and the hash zone, e.g., based on the I/O data pattern and/or compressibility of the uncompressed data. That is, in some embodiments, the defrag unit may be allocated as a segment zone in a first instance, then reclaimed by the system, e.g., through garbage collection or data reallocation, and reallocated to the hash zone, e.g., if more random mappings are required. In some embodiments, a second plurality of defrag units may be assigned in a free defrag unit pool, e.g., unused or free defrag units. The unused or free defrag units may be used for data reallocation or garbage collection as well as overflow during hash mapping.

In some example embodiments, each active partition, e.g., a partition that has data to be processed, is assigned with at least one segment defrag unit and at least one hash defrag unit in the compressed LBA space. As such, segment mappings of the uncompressed LBA to the compressed LBA go to the partition's segment defrag units and hash mappings of the uncompressed LBA to the compressed LBA go to the partition's hash defrag units.

In some embodiments, one partition may have multiple defrag units, e.g., one or more segment defrag units and/or one or more hash defrag units. In some embodiments, a defrag unit may serve multiple partitions, e.g., one hash defrag unit may serve a first partition and a second partition for random mappings from uncompressed LBA to compressed LBA, and in particular, if the first partition and the second partition have high compression ratios, e.g., greater than 50% compression of the uncompressed LBA.

In some embodiments, in order to reduce data movement overhead, the relationship between the partition(s) and the defrag unit(s) may be limited to a 1-to-N or N-to-1 relationship, e.g., to reduce the data that needs to be moved/ reallocated/garbage collected. For example, in some embodiments, a hash defrag unit may serve the first partition and the second partition, but both partitions only have one hash defrag unit (but may have segment defrag units assigned to the partitions). In another example embodiment, if a partition has two segment defrag units, then the two segment defrag units only serve this partition. While a 1-to-N or N-to-1 relationship between the partition(s) and defrag unit(s) has been discussed herein, it is appreciated that such relationship is not intending to be limiting. Rather, other relationships between the partition(s) and defrag unit(s) may also be used, for example, 2-to-N or N-2, 3-to-N or N-3, 2-to-2, 3-to-3, . . . 10-to-10, 10-to-N, N-to-10, etc. in which the relationship between the partition(s) and defrag unit(s) is bounded by an upper limit in which the assignment of the defrag units, e.g., segment zone or hash zone, is no longer differentiated, e.g., all partitions assigned to all defrag units such that data would be moved between all defrag units during data reallocation or garbage collection, which may have high overhead and no ability to dynamically adapt to the I/O request pattern. It is appreciated that the relationship or rule as discussed above between the partition(s) and defrag unit(s) applies individually to each mapping type, e.g., relationship of partition(s) to segment defrag units and relationship of partition(s) to hash defrag units. For example, in an embodiment, if both segment mapping and hash mapping are used to map the workload in a partition, the relationship between the partition and the segment defrag units is bounded by the upper limit, and the relationship between the partition and the hash defrag unit is bounded by the upper limit. As such, the relationship between the partition(s) and the defrag unit(s) is checked independently with respect to the type of defrag unit, i.e., the relationship of the partition to both the segment defrag units and hash defrag units are not checked together.

In another example embodiment of the efficient storage management and mapping may be understood as follows.

In an embodiment, after the uncompressed LBA space has been divided into a plurality of partitions, at least one of the partitions may be empty and have no defrag units assigned to it. As a user writes to the partition, via host, e.g., 210 of FIG. 2, then the system may assign at least one or both a segment defrag unit and hash defrag unit to the active partition. If a user starts writing a workload with something sequential then the partition may be assigned the segment defrag unit. If the user then writes to random data, then the system may allocate a hash defrag unit to the partition to map the hash mapping to the blocks. If at another or later time, the user writes something hard to compress, then the LBA space having the defrag units may run out of available defrag units for mapping/storage, such that the system may then allocate more defrag units to this partition.

For example, in some embodiments in which the workload includes a video which is hard to compress or not compressible, e.g., low compressibility, e.g., 10% or less, the system may assign four segment defrag units for mapping/storing the video, e.g., 16 GB video, in which four segment defrag units having 4 GB sizes are assigned in which the segment defrag units are filled sequentially, since the video may require a sequential write. If the active partition becomes full, e.g., the video is larger than 16 GB, then the system may assign the video to additional partition(s) and new segment defrag units assigned to the additional partition(s). If during the sequential write, the user wants to write something randomly, e.g., adds pictures, then the system may allocate hash defrag unit(s) to the partition for the hash mapping of the workload.

Figure 5:
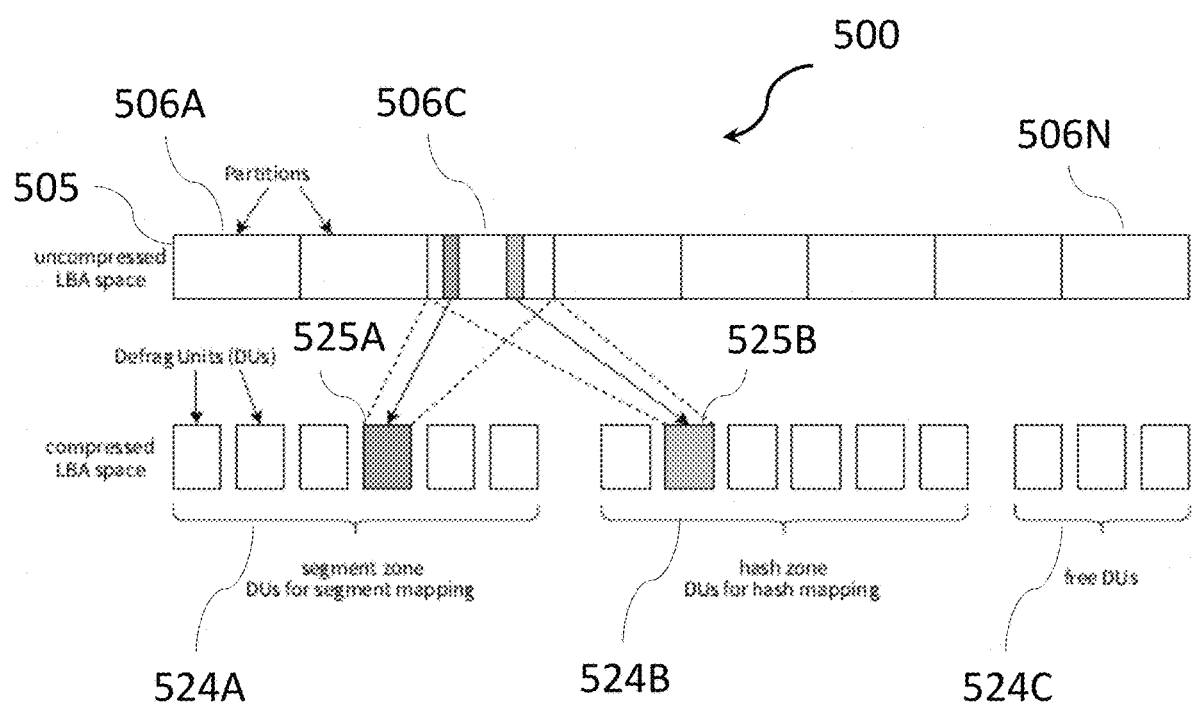
FIG. 5 is a schematic view of an example defrag unit assignment mechanism, arranged in accordance with at least some embodiments described herein.

FIG. 5 is a schematic view of an example defrag unit assignment mechanism 500, arranged in accordance with at least some embodiments described herein. In an example embodiment, the uncompressed LBA space 505 may be split into two or more partitions (506A, 506C . . . 506N). The compressed LBA space may also be split into a plurality of defrag units 524A, 524B, 524C, in which one or more of the plurality of defrag units 524A, 524B, 524C are assigned to the partitions 506A, 506N and configured to serve the mapping mode for the received data having uncompressed LBA. The plurality of defrag units 524A, 524B, 524C may be assigned to two or more zones, including, but not limited to the segment zone 524A and the hash zone 524B. In some embodiments, the plurality of defrag units may also be assigned into the free or unused zone, which may be used as needed by the system when mapping the uncompressed LBA to the compressed LBA space and/or any data reallocation or garbage collection process.

As illustrated in FIG. 5, at runtime, partition 506C may be assigned at least one segment defrag unit 525A from the segment zone 524A and at least one hash defrag unit 525B from the hash zone 524B. The at least one segment defrag unit 525A may be configured for mapping/storing of sequential data request patterns from workload received in the active partition 506C. The at least one hash defrag unit 525B may be configured for mapping of random data request patterns from the workload received in the active partition 506C. While one segment defrag unit 525A and one hash defrag unit 525B is illustrated as being assigned to partition 506C, such disclosure is not intended to be limiting, and the partition 506C may include one or more segment defrag units from segment zone 524A and/or one or more hash defrag units from hash zone 524B, and/or the segment defrag unit 525A and/or the hash defrag unit 525B may serve another partition 506A, 506N.

In some embodiments, by assigning the plurality of defrag units as being in the segment zone 524A and/or the hash zone 524B, the defrag unit assignment mechanism 500 may be able to adapt to workload patterns automatically. In an embodiment, the assignment of the plurality of defrag units to the partitions are adjusted dynamically at runtime. For example, if the workload sent to the partition 506C has a low compression ratio, e.g., less than 10% size reduction, for example, data that is hard to compress, such as MP4 videos, JPG photo, more defrag units may be assigned to the partition. In an embodiment, the assignment of the plurality of defrag units as being in the segment zone 524A and/or the hash zone 524B may be adjusted automatically. For example, if the I/O request pattern of the workload is mostly sequential, more defrag units may be allocated from the segment zone and if the I/O request pattern of the workload is mostly random, more defrag units may be allocated from the hash zone, e.g., based on the data size of the user write of the workload.

As discussed above, at least because two mapping modes may be used, different data reallocation or garbage collection mechanisms may be needed. For example, when fragmentation of a defrag unit occurs that is above a predetermined threshold, a defragmentation process for the defrag unit may be used based on the type of defrag unit, e.g., segment defrag unit or hash defrag unit. Moreover, since at least two types of mapping modes are used, the division of the segment defrag units in the segment zone and the hash defrag units in the hash zone may need to be reassigned, e.g., based on the mapping necessary for the uncompressed LBA from the user write. As such, the data reallocation or garbage collection may occur on two levels: 1) a defrag unit level (internal defrag); and 2) a zone level, as discussed below.

In an example embodiment, the internal defrag may be triggered when fragmentation inside at least one of the defrag units exceeds a predetermined threshold. In an embodiment, when the defrag unit is a segment defrag unit, the threshold may be when the number of free 32 KB units falls below a threshold. In an embodiment, when the defrag unit is a hash defrag unit, the threshold may be when too many uncompressed LBAs have been mapped to the defrag unit with an overflow bit, i.e., requires an extra read due to compressed LBA linking or overflow area. In some embodiments, only the defrag units needing defragmentation are defragmented when necessary, e.g., the compressed LBA space is divided into the defrag units and only specific defrag units are defragmented to efficiently manage computational resources. In some embodiments, the defragmentation of the defrag units occurs in batches at a predetermined time or schedule, e.g., when 10% of the defrag units need defragmentation, the defrag units are defragmented as midnight.

Figure 6:
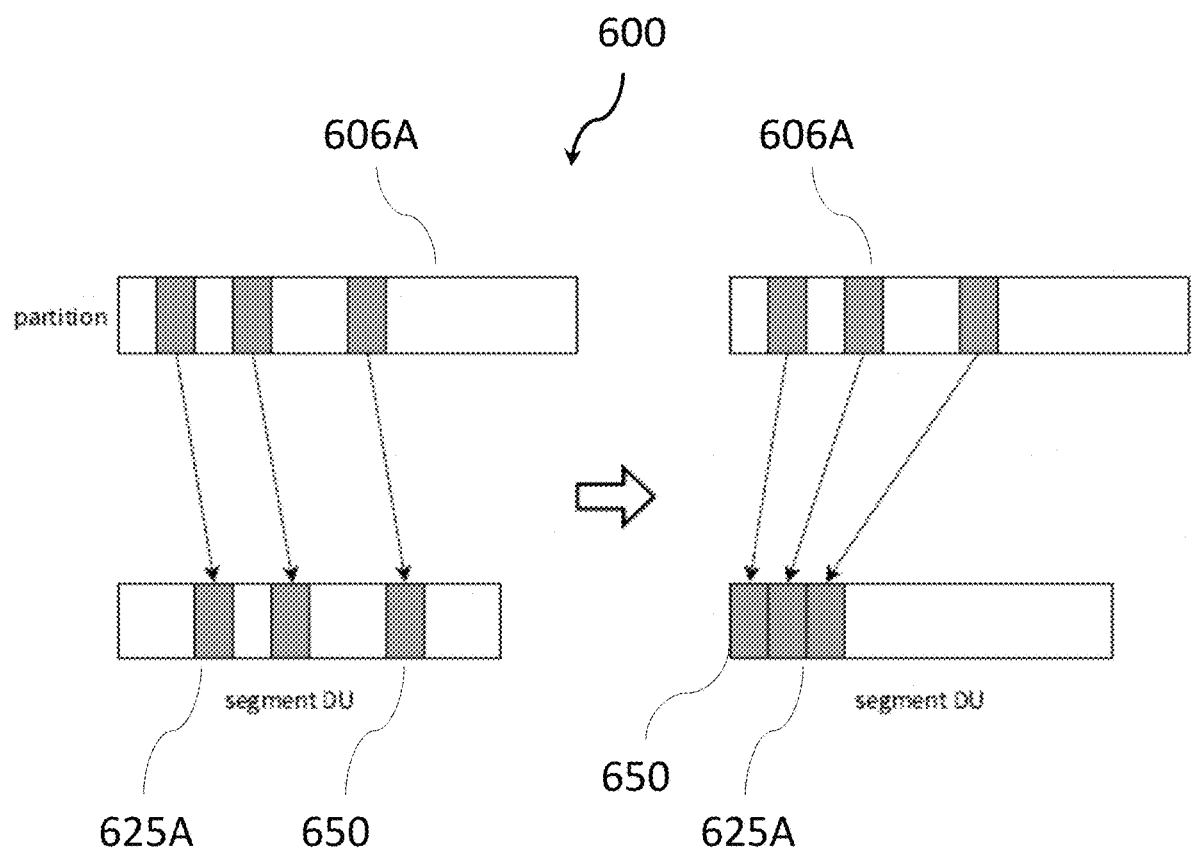
FIG. 6 is a schematic view of an example internal defragmentation mechanism for a segment defrag unit, arranged in accordance with at least some embodiments described herein.

FIG. 6 is a schematic view of an example internal defragmentation mechanism 600 for a segment defrag unit 625A, arranged in accordance with at least some embodiments described herein. The internal defragmentation mechanism 600 may include removing or combining holes or spaces between the compressed segments (or slivers) 650 on the segment defrag unit 625A. In an embodiment, as illustrated in FIG. 6, after an initial segment mapping from the partition 606A to the segment defrag unit 625A, after the internal defragmentation mechanism 600 has been triggered, the compressed segments 650 on the segment defrag unit 625A may be remapped so that the compressed segments 650 are contiguous. In another embodiment, the data from the partition 606A may be copied to an empty defrag unit, e.g., a defrag unit in the free zone or an available segment defrag unit assigned to the segment zone, and the previously used segment defrag unit may be released into the segment zone or the free zone for subsequent use during another mapping mode, e.g., adding to the unused defrag unit list and/or mark the space as available, etc. In some embodiments, the internal defragmentation mechanism 600 for the segment defrag unit 625A may be triggered when the number of free 32 KB units fall below a threshold value, e.g., 100, or 80, or 60, or 50. It is appreciated that since the defragmentation may just be movement of smaller amounts of data, e.g., from one defrag unit to another defrag unit or movement of segments on the same defrag unit instead of the entirety of the compressed LBA space, the defragmentation may not be computationally intensive. Instead, the compression may be done by the hardware device, e.g., the host CPU, SSDs, and/or an acceleration card.

Figure 7:
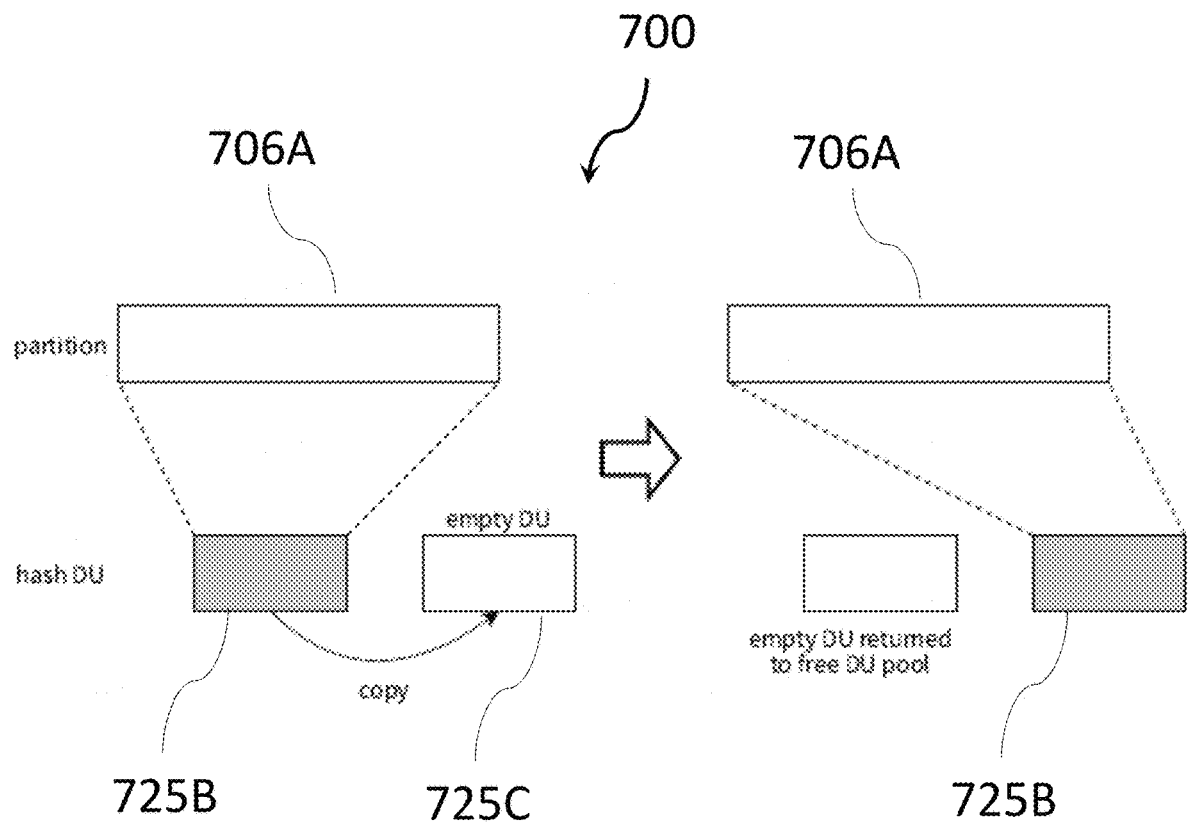
FIG. 7 is a schematic view of an example internal defragmentation mechanism for a hash defrag unit, arranged in accordance with at least some other embodiments described herein.

FIG. 7 is a schematic view of an example internal defragmentation mechanism 700 for a hash defrag unit 725B, arranged in accordance with at least some embodiments described herein. The internal defragmentation mechanism 700 may include removing fragmentation on the hash defrag unit 725B. In some embodiments, the control system 200 and/or storage management and mapping subsystem 420 may be configured to track a number of conflicts in the hash defrag unit 725B (when an uncompressed LBA is mapped to a target location in the hash defrag unit and the target location does not have enough free space). This number divided by total number of uncompressed LBAs mapped to the hash defrag unit may be an indicator of how fragmented the hash defrag unit may be. When reading an LBA with conflict, an extra read will be required. So if there are too many conflicts in the hash defrag unit, the average read latency may increase. The threshold for triggering defragmentation may depend on the performance target. For example, if each SSD read takes 80 µs, and 20% of the mapped LBAs have conflict, then the average read latency will be 96 us (80 µs*80%+160 µs*20%). The performance target may be set to be 96 µs, then the conflict rate would need to be below 20%. In an embodiment, as illustrated in FIG. 7, after an initial segment mapping from the partition 706A to the hash defrag unit 725B, the internal defragmentation mechanism 700 may be triggered such that data on the hash defrag unit 725B may be copied to an empty defrag unit 725C, which is then assigned as the hash defrag unit 725B, e.g., a defrag unit in the free zone or an available hash defrag unit assigned to the hash zone, and the previously used hash defrag unit may be released into the hash zone or the free zone for subsequent use during a mapping mode. It is appreciated that the use of the empty defrag unit can reduce fragmentation, since in some embodiments, fragmentation may occur mainly from overwriting mapped LBAs, e.g., successive write operations.

In an example embodiment, the zone level data reallocation or management may be triggered based on the systems needs for the defrag unit(s). That is, the zone level data reallocation or garbage collection mechanisms may be used to manage the defrag unit assignments between at least the segment zone and the hash zone, e.g., for non-used or unused data space. For example, in an example embodiment, the defrag units may be managed by one or more of: Expansion, Compaction, and Shrinkage.

Figure 8:
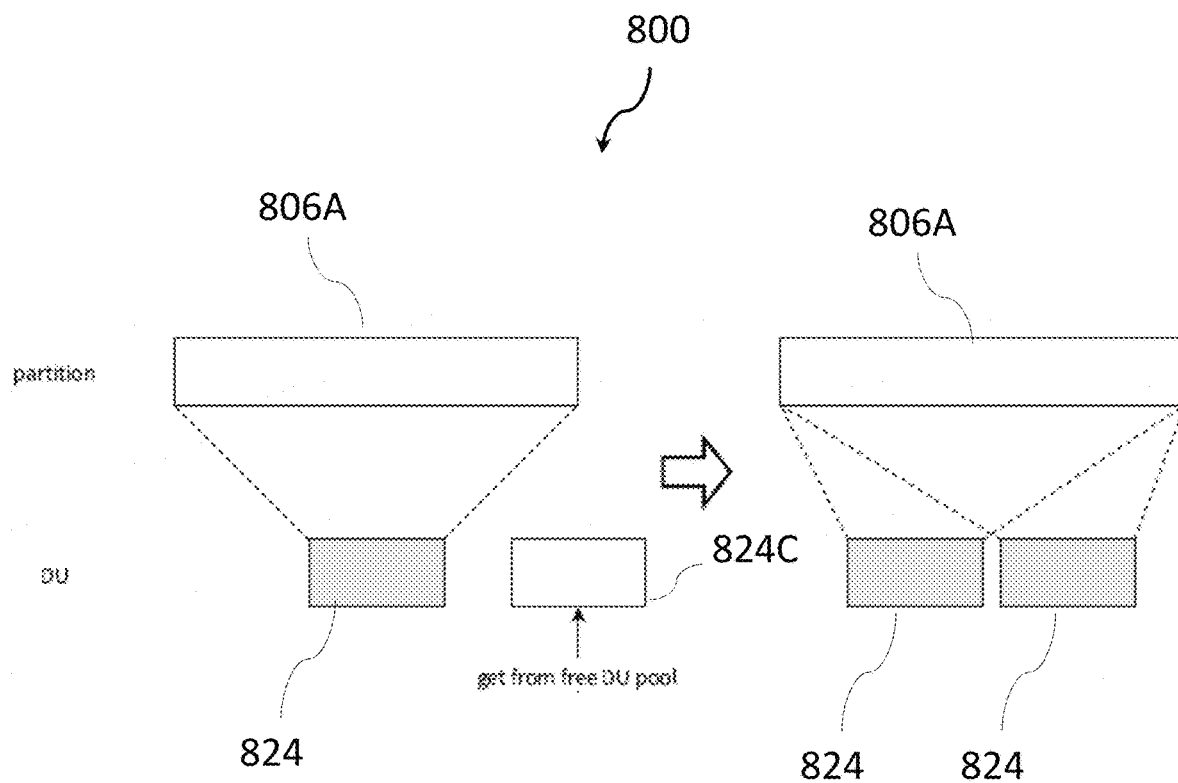
FIG. 8 is a schematic view of an example expansion mechanism, arranged in accordance with at least some other embodiments described herein.

FIG. 8 is a schematic view of an example expansion mechanism 800 of a defrag unit 824 for a single partition 806A, e.g., the defrag unit is only serving one partition, arranged in accordance with at least some embodiments described herein. The expansion mechanism 800 may include adding a defrag unit when the assigned defrag unit 824 is too full, for example, when the defrag unit is 70%, 80% or 90% full. In an embodiment, as illustrated in FIG. 8, after the assignment of a defrag unit 824 to the active partition 806A, if during the writing and/or mapping of the uncompressed LBA the defrag unit 806A is too full, for example, 70%, 80% or 90% of capacity, a free defrag unit 824C is added, e.g., from the free or unused zone or from the segment zone or hash zone, to serve the partition 806A. For example, in some embodiments, if the defrag unit 824 is a hash defrag unit, e.g., 324B of FIG. 3 or 424B of FIG. 4, the partition may be remapped to the expanded compressed LBA range, e.g., defrag unit 824 and the free defrag unit 824C. It is appreciated that since the partition is being remapped, such remapping has an added benefit in that fragmentation of the defrag unit, e.g., hash defrag unit 324B of FIG. 3 or 424B of FIG. 4, is reduced, since all of the data is being remapped to a larger compressed LBA space. In an embodiment, if the defrag unit 824 is a segment defrag unit, e.g., 324A of FIG. 3 or 424A of FIG. 4, the free defrag unit 824C is used for allocating new segments in the partition 806A.

In an embodiment, the expansion mechanism 800 may be used during overflow occurring during the hash mapping of the uncompressed LBA to the compressed LBA. It is to be understood that "overflow" may refer to a situation that for an uncompressed block address (of uncompressed data), none of the hash functions in the set of hash functions may find a mapping (to a compressed block address) with enough free slivers or space on the block storage device to store the compressed data. It is also to be understood that when the block storage device (e.g., a disk, a compressed block address space in the disk, etc.) is not very full, overflow may rarely happen since multiple hash functions are executed to find the mapping on the block storage device for storing the compressed data. It is further to be understood that when the block storage device is close to full, the probability of overflow may increase.

In an example embodiment, when the overflow occurs (i.e., none of the hash functions in the set of hash functions may find a mapping (to a compressed block address) with enough free slivers or space to store the compressed data), the hash function that has a mapping (to a compressed block address) with the most free slivers or space may be chosen and its index may be saved in the entry of the hash table. In the write process flow, the processor may split the compressed data into multiple parts (e.g., in a same or variable length), store the split parts in multiple compressed block addresses, e.g., multiple defrag units 824 and 824C, and link the split parts together using e.g., link(s). The link(s) may be stored in a metadata area of the block (e.g., provided on the block storage device), or as a part of the (split) compressed data (e.g. in a header of the (split) compressed data).

It is further to be understood that when overflow occurs, in the write process, the overflow bit or bitmap may be updated to indicate the overflow to the free defrag unit 824C. If the compressed block address has metadata (e.g., that includes the link(s) to the next split compressed data, etc.), in the write process, the metadata bit or bitmap may be updated to indicate that the compressed block address has metadata. Accordingly, in the write process, when deallocating the address, the area or space having the split compressed data (and/or its header or metadata) may be deallocated based on the overflow bit or bitmap and/or the metadata bit or bitmap (and/or the header or metadata of the split compressed data). Accordingly, in the read process, when reading the compressed data, the overflow bit or bitmap and/or the metadata bit or bitmap (and/or the header or metadata of the split compressed data) may be checked to ensure that all the split compressed data are read, e.g., requires an extra read.

Figure 9:
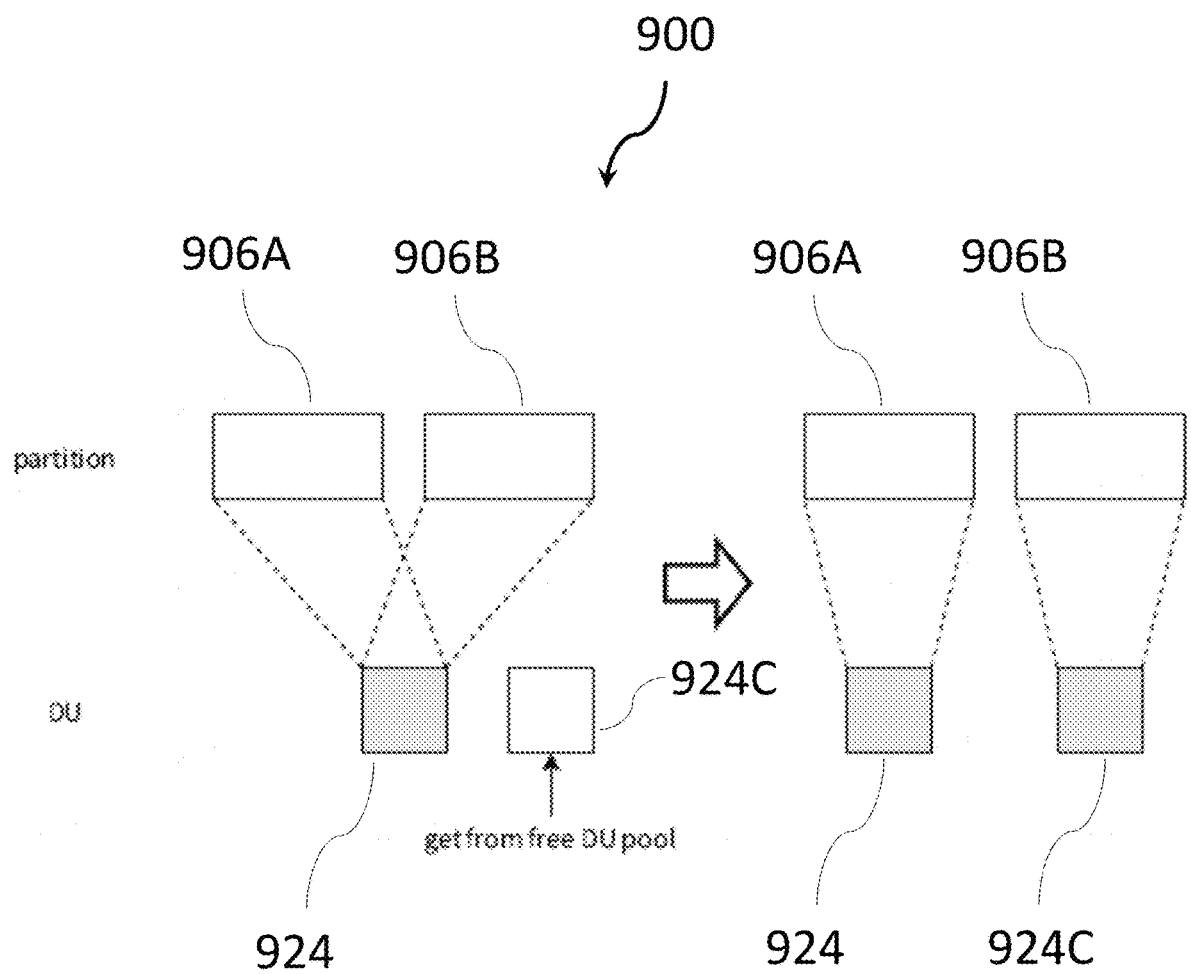
FIG. 9 is a schematic view of another example expansion mechanism, arranged in accordance with at least some other embodiments described herein.

FIG. 9 is a schematic view of an example expansion mechanism 900 of a defrag unit 924 that serves multiple partitions 906A, 906B, arranged in accordance with at least some embodiments described herein. The expansion mechanism 900 may include adding a defrag unit 924C when the assigned defrag unit 924 is too full. In an embodiment, as illustrated in FIG. 9, after the assignment of a defrag unit 924 to at least two active partitions 906A, 906B, if during the mapping of the uncompressed LBA the defrag unit 906A is too full, e.g., greater than 90%, a free defrag unit 924C is added, e.g., from the free defrag unit pool or from the segment zone or hash zone, to serve the partitions 906A, 906B, in which data from the partitions 906A, 906B may be moved to the new defrag unit to free up space in the defrag unit 924. In some embodiments, data in some of the partitions 906A, 906B may be moved to the new defrag unit 924C, such that the new defrag unit 924C serves one or both the partitions 906A, 906B. In some embodiments, all of the data from one partition 906B may be moved to the new defrag unit 924C to serve the partition 906B and the defrag unit 924 is freed to serve only the partition 906A. For example, in some embodiments, if the defrag unit 924 is a hash defrag unit, e.g., 324B of FIG. 3 or 424B of FIG. 4, some of the data in the partition(s) 906A, 906B may be remapped to the new defrag unit 924C to free up space on the defrag unit 924. In an embodiment, if the defrag unit 924 is a segment defrag unit, e.g., 324A of FIG. 3 or 424A of FIG. 4, some of the data in the partition(s) 906A, 906B may be moved to the new defrag unit 924C to free up space on the defrag unit 924. It is appreciated that in some embodiments, the free defrag unit 924C is added to free up space in the defrag unit 924 such that a N-to-1 or 1-to-N relationship is maintained between the partition(s) and defrag unit(s) to keep the data moved/remapped bounded. In some embodiments, if the relationship between the partition(s) and defrag unit(s) exceeds an upper limit, e.g., 100 partitions mapped to 50 defrag units, the relationship may become unbounded and the overhead may grow, e.g., amount of data moved/remapped is large and would have high overhead. Moreover, if the relationship between the partition(s) and defrag unit(s) is too high, the dynamisms of the adaptive mapping may not be achieved, e.g., there would no longer be separate defrag units of the compressed LBA space that may be used to serve the segment mapping mode and/or the hash mapping mode.

Figure 10:
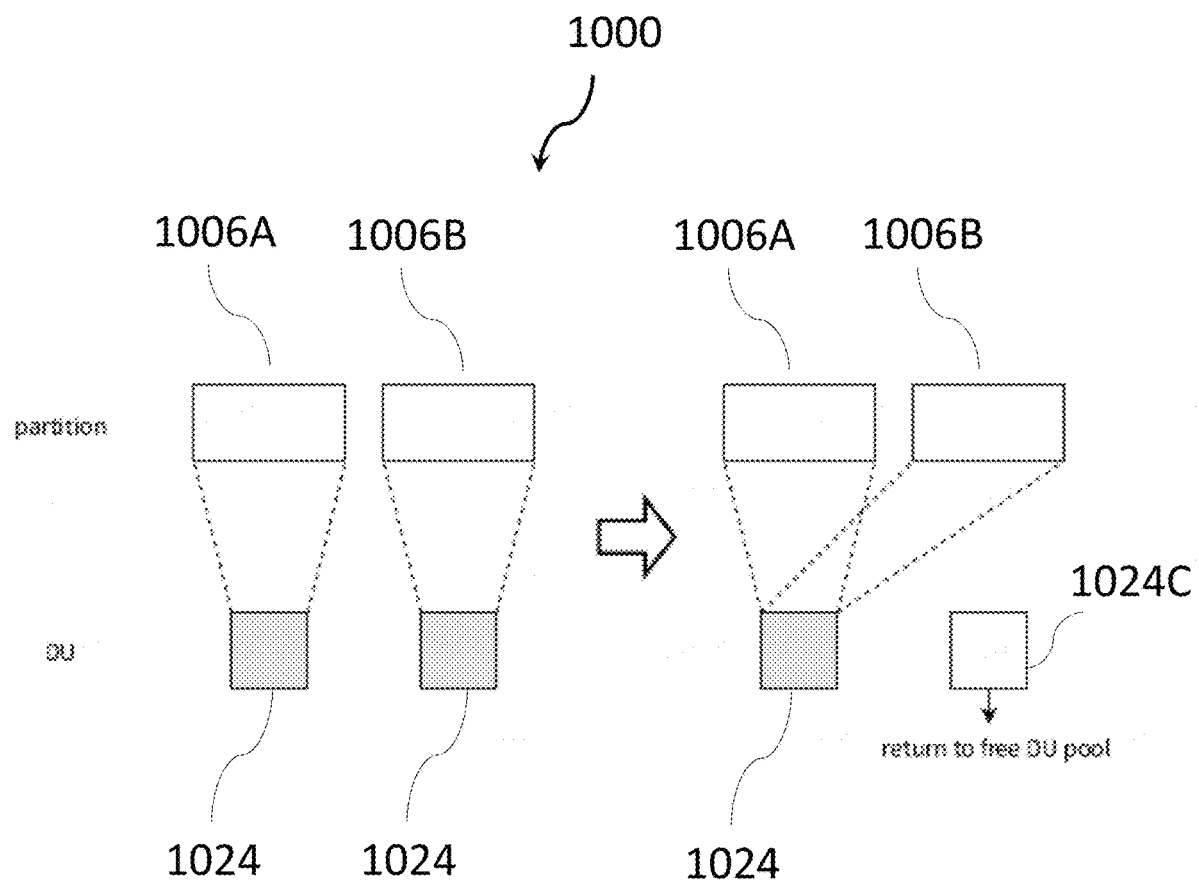
FIG. 10 is a schematic view of an example compaction mechanism, arranged in accordance with at least some other embodiments described herein.

FIG. 10 is a schematic view of an example compaction mechanism 1000 of defrag units 1024 that each serve partitions 1006A, 1006B, arranged in accordance with at least some embodiments described herein. The compaction mechanism 1000 may include removing a defrag unit when the usage of one of the defrag units 1024 is low and freeing up the other defrag unit 1024. In an embodiment, as illustrated in FIG. 10, after the assignment of the defrag units 1024 to the active partitions 1006A, 1006B, if usage on the defrag units 1024 is below a predetermined threshold, for example, 30%, 25%, or 20% or less, the partitions 1006A, 1006B may be moved/remapped to a single defrag unit 1024 and the other defrag unit 1024C may be freed to return to the defrag unit pool or assigned for serving the respective zone, e.g., segment zone or hash zone. As such, after compaction, the defrag unit 1024 may have 50% usage and used to serve both partitions 1006A, 1006B. In some embodiments, the partition 1006A, 1006B and associated defrag unit 1024 with the least amount of data to be moved/remapped may be chosen for the moving/remapping to the single defrag unit 1024.

Figure 11:
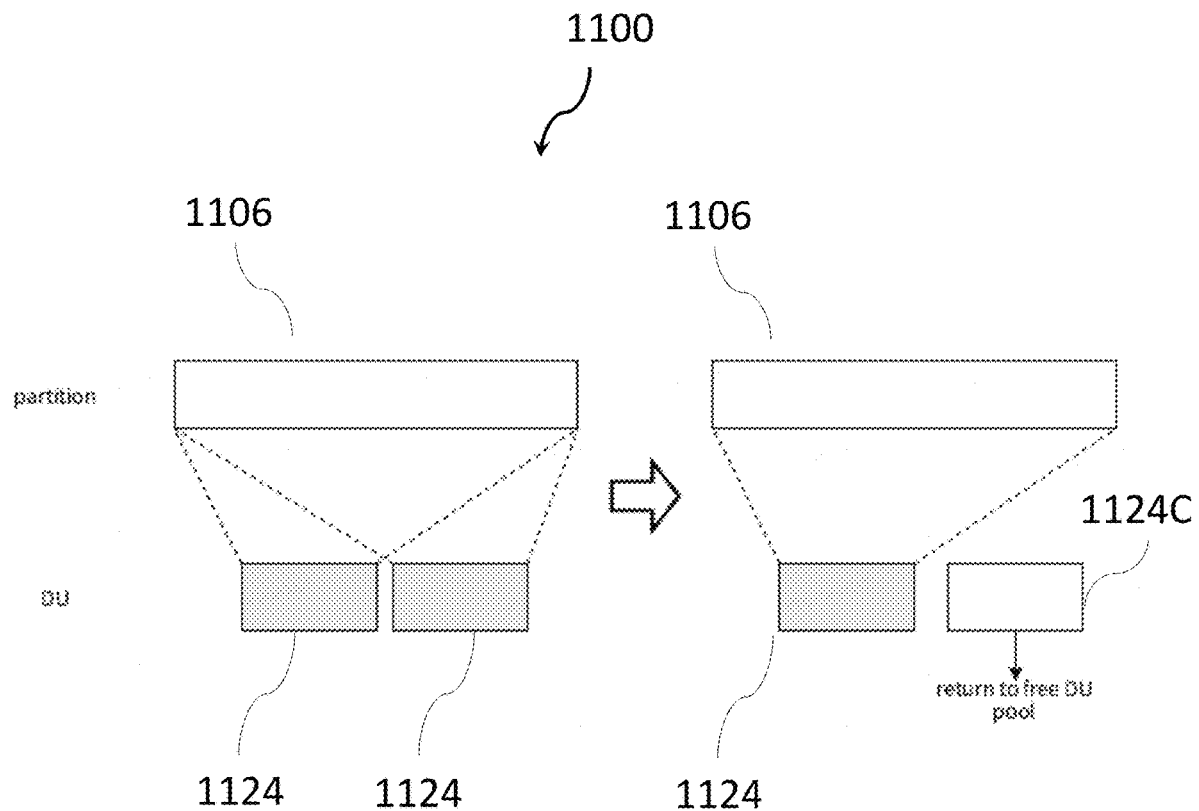
FIG. 11 is a schematic view of an example shrinkage mechanism, arranged in accordance with at least some other embodiments described herein.

FIG. 11 is a schematic view of an example shrinkage mechanism 1100 of defrag units 1124 that each serve partition 1106, arranged in accordance with at least some embodiments described herein. The shrinkage mechanism 1100 may include removing a defrag unit when the usage of the total capacity of the defrag units 1124 is low, e.g., low capacity usage, to free up the other defrag unit 1124. In an embodiment, as illustrated in FIG. 11, after the assignment of the defrag units 1124 to the active partition 1106, if usage of the total capacity on the defrag units 1124 is below a predetermined threshold, e.g., 25%, the assignment of the defrag units 1124 to the partition 1106 may be shrunk, e.g., moved/remapped, to a single defrag unit 1124 and the other defrag unit 1124C may be freed to return to the defrag unit pool or assigned for serving the respective zone, e.g., segment zone or hash zone.

It is appreciated that while the reallocation or garbage collection has been discussed above as occurring separately, such disclosure is not intending to be limiting. Instead, it is understood that the two level reallocation or garbage collection may occur subsequently or separately, in which the two-level reallocation or garbage collection at the defrag unit level (internal defrag) and the zone level may be used in any of the embodiment discussed herein. In an embodiment, after the assigning of the at least one segment defrag unit or hash defrag unit to the active partition, the assignment of the segment defrag unit or the hash defrag unit may be reallocated to the at least one active partition, e.g., based on the workload as discussed above with respect to FIGS. 8-11. Such reassignment may further include reallocating any non-used data space in at least one reassigned defrag unit or the at least one segment defrag unit or the at least one hash defrag unit based on whether the defrag unit is the segment defrag unit or the hash defrag unit, e.g., as discussed above with respect to FIGS. 6 and 7. As such, the two-level reallocation or garbage collection may be used for further improved dynamic management of the storage of data.

FIG. 12 is a schematic structural diagram of an example computer system 1200 applicable to implementing an electronic device (for example, the server or one of the terminal devices shown in FIG. 1), arranged in accordance with at least some embodiments described herein. It is to be understood that the computer system shown in FIG. 12 is provided for illustration only instead of limiting the functions and applications of the embodiments described herein.

As depicted, the computer system 1200 may include a central processing unit (CPU) 1205. The CPU 1205 may perform various operations and processing based on programs stored in a read-only memory (ROM) 1210 or programs loaded from a storage device 1240 to a random-access memory (RAM) 1215. The RAM 1215 may also store various data and programs required for operations of the system 1200. The CPU 1205, the ROM 1210, and the RAM 1215 may be connected to each other via a bus 1220. An input/output (I/O) interface 1225 may also be connected to the bus 1220.

The components connected to the I/O interface 1225 may further include an input device 1230 including a keyboard, a mouse, a digital pen, a drawing pad, or the like; an output device 1235 including a display such as a liquid crystal display (LCD), a speaker, or the like; a storage device 1240 including a hard disk or the like; and a communication device 1245 including a network interface card such as a LAN card, a modem, or the like. The communication device 1245 may perform communication processing via a network such as the Internet, a WAN, a LAN, a LIN, a cloud, etc. In an embodiment, a driver 1250 may also be connected to the I/O interface 1225. A removable medium 1255 such as a magnetic disk, an optical disk, a magneto-optical disk, a semiconductor memory, or the like may be mounted on the driver 1250 as desired, such that a computer program read from the removable medium 1255 may be installed in the storage device 1240.

Features of the embodiments disclosed herein may provide transparent block device level compression that combines the segment based mapping and the hash mapping which can adapt to the workload's I/O request pattern dynamically at runtime. Architectural design of the adaptive mapping scheme includes an adaptive design combining the segment mapping and the hash mapping and mapping/storage of the workload on specific segment defrag units and/or hash defrag units based on the workload's I/O request pattern. Features of the embodiments disclosed herein may provide efficient data capacity management by managing usage (e.g., reassignment/allocation) of the segment defrag units and hash defrag units, defragmenting/reallocating the defrag units, and/or using the adaptive mapping mixed mapping methods. Mapping entries can be converted between the segment mapping and the flat hash table mapping at runtime.

It is to be understood that the processes described with reference to the flowcharts and/or the processes described in other figures may be implemented as computer software programs or in hardware. The computer program product may include a computer program stored in a computer readable non-volatile medium. The computer program includes program codes for performing the method shown in the flowcharts and/or GUIs. In this embodiment, the computer program may be downloaded and installed from the network via the communication device 1245, and/or may be installed from the removable medium 1255. The computer program, when being executed by the central processing unit (CPU) 1205, can implement the above functions specified in the method in the embodiments disclosed herein.

It is to be understood that the disclosed and other solutions, examples, embodiments, modules and the functional operations described in this document can be implemented in digital electronic circuitry, or in computer software, firmware, or hardware, including the structures disclosed in this document and their structural equivalents, or in combinations of one or more of them. The disclosed and other embodiments can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this document can be performed by one or more programmable processors executing one or more computer programs to perform functions by operating on input data and generating output. The processes and logic flows can also be performed by, and apparatus can also be implemented as, special purpose logic circuitry, e.g., a field programmable gate array, an application specific integrated circuit, or the like.

Processors suitable for the execution of a computer program include, by way of example, both general and special purpose microprocessors, and any one or more processors of any kind of digital computer. Generally, a processor will receive instructions and data from a read only memory or a random-access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., erasable programmable read-only memory, electrically erasable programmable read-only memory, and flash memory devices; magnetic disks, e.g., internal hard disks or removable disks; magneto optical disks; and compact disc read-only memory and digital video disc read-only memory disks. The processor and the memory can be supplemented by, or incorporated in, special purpose logic circuitry.

It is to be understood that different features, variations and multiple different embodiments have been shown and described with various details. What has been described in this application at times in terms of specific embodiments is done for illustrative purposes only and without the intent to limit or suggest that what has been conceived is only one particular embodiment or specific embodiments. It is to be understood that this disclosure is not limited to any single specific embodiments or enumerated variations. Many modifications, variations and other embodiments will come to mind of those skilled in the art, and which are intended to be and are in fact covered by both this disclosure. It is indeed intended that the scope of this disclosure should be determined by a proper legal interpretation and construction of the disclosure, including equivalents, as understood by those of skill in the art relying upon the complete disclosure present at the time of filing.

Aspects:

It is appreciated that any one of aspects can be combined with each other.

Aspect 1. A method for adaptive mapping for data compression on a storage device, the method comprising: determining a data request pattern of a workload for storing on the storage device; determining whether to use at least one of a segment mapping mode or a hash mapping mode for mapping the workload based on the data request pattern; dividing a space on the storage device into a plurality of defrag units for storing data; assigning the plurality of defrag units as being at least one of a segment defrag unit for a segment zone for serving the segment mapping mode or a hash defrag unit for a hash zone for serving the hash mapping mode; when the data request pattern is for the segment mapping mode, storing the data on at least one of the plurality of defrag units assigned as the segment defrag unit; and when the data request pattern is for the hash mapping mode, storing the data on at least one of the plurality of defrag units assigned as the hash defrag unit.

Aspect 2. The method of Aspect 1, further including dynamically switching between storing the data on the at least one of the plurality of defrag units assigned as the segment defrag unit and storing the data on at least one of the plurality of defrag units assigned as the hash defrag unit based on the determined data request pattern, wherein the data request pattern includes at least one of a sequential pattern or a random pattern, and the dynamically switching includes: switching to the storing the data on the at least one of the plurality of defrag units assigned as the segment defrag unit when the determined data request pattern is the sequential pattern; and switching to the storing the data on the at least one of the plurality of defrag units assigned as the hash defrag unit when the determined data request pattern is the random pattern.

Aspect 3. The method of any of Aspects 1 or 2, wherein the assigning the plurality of defrag units as being at least one of the segment defrag unit or the hash defrag unit includes dynamically reassigning the plurality of defrag units as being the segment defrag unit or the hash defrag unit at runtime.

Aspect 4. The method of Aspect 3, wherein the dynamically reassigning the plurality of defrag units includes reclaiming defrag units during memory management at runtime.

Aspect 5. The method of any of Aspects 1-4, further comprising dividing uncompressed data space into a plurality of partitions.

Aspect 6. The method of Aspect 5, further comprising assigning at least one segment defrag unit to at least one active partition of the plurality of partitions and at least one hash defrag unit to the at least one active partition of the plurality of partitions, wherein when at least two defrag units of the plurality of defrag units are separately assigned to at least two active partitions and the at least two defrag units have low usage, moving or remapping the data stored on the at least two defrag units to one of the at least two defrag units assigned to the at least two active partitions.

Aspect 7. The method of Aspect 5, wherein the segment defrag unit and/or the hash defrag unit is assigned to at least two active partitions.

Aspect 8. The method of any of Aspects 6 or 7, wherein when the workload that is mapped to the at least one active partition has a low compression ratio, at least one second defrag unit is assigned to the at least one active partition.

Aspect 9. The method of any of Aspects 6-8, wherein the assigning the plurality of defrag units includes dynamically assigning the segment defrag unit and the hash defrag unit based on the determined data request pattern by at least one of: assigning at least one unused defrag unit as an additional segment defrag unit when the determined data request pattern is the sequential pattern; and assigning at least one unused defrag unit as an additional hash defrag unit when the determined data request pattern is the random pattern.

Aspect 10. The method of any of Aspects 1 to 9, wherein the assigning the plurality of defrag units as being at least one of the segment defrag unit or the hash defrag unit further includes assigning defrag units as unused defrag units.

Aspect 11. The method of any of Aspects 1-10, further comprising reallocating non-used data space on the storage device.

Aspect 12. The method of Aspect 11, wherein the reallocating the non-used data space includes: when the non-used data space is stored on the segment defrag unit, the reallocating includes remapping compressed segments of the data stored on the at least one segment defrag unit so that the compressed segments are contiguous or copying the compressed segments to an empty segment defrag unit and releasing the segment defrag unit, and/or when the non-used data space is stored on the hash defrag unit, the reallocating includes copying the compressed segments on the data stored on the at least one hash defrag unit to an empty hash defrag unit and releasing the at least one hash defrag unit.

Aspect 13. The method of any of Aspects 6-12, further comprising reallocating the assigned plurality of defrag units assigned as the segment defrag unit or the hash defrag unit wherein: when at least one defrag unit of the plurality of defrag units is full, assigning a secondary defrag unit that is assigned as an unused defrag unit to the at least one active partition, wherein when the at least one defrag unit is the hash defrag unit, remapping the uncompressed data on the partition to the at least one defrag unit and the secondary defrag unit, and wherein when the at least one defrag unit is the segment defrag unit, using the secondary defrag unit for allocating segment mappings from the partition.

Aspect 14. The method of any of Aspects 6-13, further comprising reallocating the plurality of defrag units assigned as the segment defrag unit or the hash defrag unit wherein: when at least two defrag units of the plurality of defrag units assigned to at least two active partitions have low usage, moving or remapping the data stored on the at least two defrag units to one of the at least two defrag units assigned to the at least two active partitions.

Aspect 15. The method of any of Aspects 6-14, further comprising reallocating the plurality of defrag units assigned as the segment defrag unit or the hash defrag unit wherein: when at least two defrag units of the plurality of defrag units assigned to the at least one active partition has low capacity usage, moving or remapping the data stored on one of the at least two defrag units to a second one of the at least two defrag units and releasing the one of the at least two defrag units in which the data was moved or remapped. Aspect 16. The method of any of Aspects 6-15, further comprising: reallocating the assigning of the at least one segment defrag unit or the at least one hash defrag unit to the at least one active partition based on the workload; and reallocating any non-used data space in any reallocated defrag unit or the at least one segment defrag unit or the at least one hash defrag unit based on whether the defrag unit is the segment defrag unit or the hash defrag unit.

Aspect 17. A method for adaptive managing for data on a storage device, the method comprising: dividing uncompressed data space into a plurality of partitions; dividing a compressed data space on the storage device into a plurality of storage segments; assigning segments of the plurality of storage segments to each of the plurality of partitions; and dynamically managing storage of the data for the storage device by dynamically storing the data between storing the data on the segments of the plurality of storage segments assigned to the plurality of partitions.

Aspect 18. The method of Aspect 17, further comprising dynamically reallocating usage of data space storing the data on the plurality of storage segments by performing at least one of: expanding a number of storage segments assigned to at least one partition of the plurality of partitions; compacting the number of storage segments assigned to the plurality of partitions; and shrinking the number of storage segments assigned to the at least one partition.

Aspect 19. A storage device control system, the system comprising: a memory region tracking a shared mapping table; a processor configured to: determine a data request pattern of a workload for storing on the storage device; determine whether to use at least one of a segment mapping mode or a hash mapping mode for mapping the workload based on the data request pattern; divide a space on the storage device into a plurality of defrag units for storing data; assign the plurality of defrag units as being at least one of a segment defrag unit for a segment zone for serving the segment mapping mode or a hash defrag unit for a hash zone for serving the hash mapping mode; when the data request pattern is for the segment mapping mode, store the data on at least one of the plurality of defrag units assigned as the segment defrag unit; and when the data request pattern is for the hash mapping mode, store the data on at least one of the plurality of defrag units assigned as the hash defrag unit.

Aspect 20. The storage device control system according to Aspect 18, wherein the data request pattern includes at least one of a sequential pattern or a random pattern, and the processor is further configured to: dynamically switch between storing the data on the at least one of the plurality of defrag units assigned as the segment defrag unit and storing the data on at least one of the plurality of defrag units assigned as the hash defrag unit based on the determined data request pattern that includes: switching to the storing the data on the at least one of the plurality of defrag units assigned as the segment defrag unit when the determined data request pattern is the sequential pattern; and switching to the storing the data on the at least one of the plurality of defrag units assigned as the hash defrag unit when the determined data request pattern is the random pattern.

Aspect 21. The storage device control system according to any of Aspects 19 or 20, wherein the processor is further configured to: divide uncompressed data space into a plurality of partitions, assign at least one segment defrag unit to at least one active partition of the plurality of partitions and at least one hash defrag unit to the at least one active partition of the plurality of partitions, when the data request pattern is determined to be for the segment mapping mode, store the data on the at least one segment defrag unit assigned to the at least one active partition, and when the data request pattern is for the hash mapping mode, store of the data on the at least one hash defrag unit assigned to the at least one active partition.

Aspect 22. A non-transitory computer-readable medium having computer-executable instructions stored thereon that, upon execution, cause one or more processors to perform operations comprising: determining an input/output (I/O) request pattern of a workload for storing on a storage device; determining whether to use at least one of a segment mapping mode or a hash mapping mode for mapping the workload based on the I/O request pattern; dividing space on storage device into a plurality of defrag units for storing data; assigning the plurality of defrag units as being at least one of a segment defrag unit for a segment zone for serving the segment mapping mode or a hash defrag unit for a hash zone for serving the hash mapping mode; when the I/O request pattern is for the segment mapping mode, storing the data on at least one of the plurality of defrag units assigned as the segment defrag unit; and when the I/O request pattern is for the hash mapping mode, storing the data on at least one of the plurality of defrag units assigned as the hash defrag unit.

The terminology used in this specification is intended to describe particular embodiments and is not intended to be limiting. The terms "a," "an," and "the" include the plural forms as well, unless clearly indicated otherwise. The terms "comprises" and/or "comprising," when used in this specification, specify the presence of the stated features, integers, steps, operations, elements, and/or components, but do not preclude the presence or addition of one or more other features, integers, steps, operations, elements, and/or components.

With regard to the preceding description, it is to be understood that changes may be made in detail, especially in matters of the construction materials employed and the shape, size, and arrangement of parts without departing from the scope of the present disclosure. This specification and the embodiments described are exemplary only, with the true scope and spirit of the disclosure being indicated by the claims that follow.

What is claimed is:
1. A method for adaptive mapping for data compression on a storage device, the method comprising:
  determining a data request pattern of a workload for storing on the storage device;

determining whether to use at least one of a segment mapping mode or a hash mapping mode for mapping the workload based on the data request pattern;

dividing a space on the storage device into a plurality of defrag units for storing data;

assigning the plurality of defrag units as being at least one of a segment defrag unit for a segment zone for serving the segment mapping mode or a hash defrag unit for a hash zone for serving the hash mapping mode;

when the data request pattern is for the segment mapping mode, storing the data on at least one of the plurality of defrag units assigned as the segment defrag unit; and when the data request pattern is for the hash mapping mode, storing the data on at least one of the plurality of defrag units assigned as the hash defrag unit.

2. The method of claim 1, further including dynamically switching between storing the data on the at least one of the plurality of defrag units assigned as the segment defrag unit and storing the data on at least one of the plurality of defrag units assigned as the hash defrag unit based on the determined data request pattern, wherein the data request pattern includes at least one of a sequential pattern or a random pattern, and the dynamically switching includes:

switching to the storing the data on the at least one of the plurality of defrag units assigned as the segment defrag unit when the determined data request pattern is the sequential pattern; and switching to the storing the data on the at least one of the plurality of defrag units assigned as the hash defrag unit when the determined data request pattern is the random pattern.

3. The method of claim 1, wherein the assigning the plurality of defrag units as being at least one of the segment defrag unit or the hash defrag unit includes dynamically reassigning the plurality of defrag units as being the segment defrag unit or the hash defrag unit at runtime.

4. The method of claim 3, wherein the dynamically reassigning the plurality of defrag units includes reclaiming defrag units during memory management at runtime.

5. The method of claim 1, further comprising dividing uncompressed data space into a plurality of partitions.

6. The method of claim 5, further comprising assigning at least one segment defrag unit to at least one active partition of the plurality of partitions and at least one hash defrag unit to the at least one active partition of the plurality of partitions, wherein when the data request pattern is determined to be for the segment mapping mode, storing the data on the at least one segment defrag unit assigned to the at least one active partition, and when the data request pattern is for the hash mapping mode, storing of the data on the at least one hash defrag unit assigned to the at least one active partition.

7. The method of claim 5, wherein the segment defrag unit and/or the hash defrag unit is assigned to at least two active partitions.

8. The method of claim 6, wherein when the workload that is mapped to the at least one active partition has a low compression ratio, at least one second defrag unit is assigned to the at least one active partition.

9. The method of claim 6, wherein the assigning the plurality of defrag units includes dynamically assigning the segment defrag unit and the hash defrag unit based on the determined data request pattern by at least one of:

assigning at least one unused defrag unit as an additional segment defrag unit when the determined data request pattern is the sequential pattern; and assigning at least one unused defrag unit as an additional hash defrag unit when the determined data request pattern is the random pattern.

10. The method of claim 1, wherein the assigning the plurality of defrag units as being at least one of the segment defrag unit or the hash defrag unit further includes assigning defrag units as unused defrag units.

11. The method of claim 1, further comprising reallocating non-used data space on the storage device.

12. The method of claim 11, wherein the reallocating the non-used data space includes:

when the non-used data space is stored on the segment defrag unit, the reallocating includes remapping compressed segments of the data stored on the at least one segment defrag unit so that the compressed segments are contiguous or copying the compressed segments to an empty segment defrag unit and releasing the segment defrag unit, and/or when the non-used data space is stored on the hash defrag unit, the reallocating includes copying the compressed segments on the data stored on the at least one hash defrag unit to an empty hash defrag unit and releasing the at least one hash defrag unit.

13. The method of claim 6, further comprising reallocating the assigned plurality of defrag units assigned as the segment defrag unit or the hash defrag unit wherein:

when at least one defrag unit of the plurality of defrag units is full, assigning a secondary defrag unit that is assigned as an unused defrag unit to the at least one active partition, wherein when the at least one defrag unit is the hash defrag unit, remapping the uncompressed data on the partition to the at least one defrag unit and the secondary defrag unit, and wherein when the at least one defrag unit is the segment defrag unit, using the secondary defrag unit for allocating segment mappings from the partition.

14. The method of claim 6, further comprising reallocating the plurality of defrag units assigned as the segment defrag unit or the hash defrag unit wherein:

when at least two defrag units of the plurality of defrag units are separately assigned to at least two active partitions and the at least two defrag units have low usage, moving or remapping the data stored on the at least two defrag units to one of the at least two defrag units assigned to the at least two active partitions.

15. The method of claim 6, further comprising reallocating the plurality of defrag units assigned as the segment defrag unit or the hash defrag unit wherein:

when at least two defrag units of the plurality of defrag units assigned to the at least one active partition has low capacity usage, moving or remapping the data stored on one of the at least two defrag units to a second one of the at least two defrag units and releasing the one of the at least two defrag units in which the data was moved or remapped.

16. The method of claim 6, further comprising:

reallocating the assigning of the at least one segment defrag unit or the at least one hash defrag unit to the at least one active partition based on the workload; and reallocating any non-used data space in any reallocated defrag unit or the at least one segment defrag unit or the at least one hash defrag unit based on whether the defrag unit is the segment defrag unit or the hash defrag unit.

17. A storage device control system, the system comprising:

a memory region tracking a shared mapping table;
a processor configured to:
- determine a data request pattern of a workload for storing on the storage device;
- determine whether to use at least one of a segment mapping mode or a hash mapping mode for mapping the workload based on the data request pattern;
- divide a space on the storage device into a plurality of defrag units for storing data;
- assign the plurality of defrag units as being at least one of a segment defrag unit for a segment zone for serving the segment mapping mode or a hash defrag unit for a hash zone for serving the hash mapping mode;
- when the data request pattern is for the segment mapping mode, store the data on at least one of the plurality of defrag units assigned as the segment defrag unit; and
- when the data request pattern is for the hash mapping mode, store the data on at least one of the plurality of defrag units assigned as the hash defrag unit.

18. The storage device control system according to claim 17, wherein the data request pattern includes at least one of a sequential pattern or a random pattern, and the processor is further configured to:

dynamically switch between storing the data on the at least one of the plurality of defrag units assigned as the segment defrag unit and storing the data on at least one of the plurality of defrag units assigned as the hash defrag unit based on the determined data request pattern that includes:
- switching to the storing the data on the at least one of the plurality of defrag units assigned as the segment defrag unit when the determined data request pattern is the sequential pattern; and
- switching to the storing the data on the at least one of the plurality of defrag units assigned as the hash defrag unit when the determined data request pattern is the random pattern.

* * * * *